United States Patent [19]
Maher et al.

[11] Patent Number: 6,103,055
[45] Date of Patent: *Aug. 15, 2000

[54] SYSTEM FOR PROCESSING SUBSTRATES

[75] Inventors: Joseph A. Maher, South Hamilton, Mass.; E. John Vowles, Goffstown; Joseph D. Napoli, Winham, both of N.H.; Arthur W. Zafiropoulo, Manchester; Mark W. Miller, Burlington, both of Mass.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/502,860

[22] Filed: Jul. 14, 1995

Related U.S. Application Data

[63] Continuation of application No. 08/234,312, Apr. 28, 1994, abandoned, which is a continuation of application No. 07/863,723, Apr. 3, 1992, Pat. No. 5,308,431, which is a continuation of application No. 07/689,357, Apr. 22, 1991, Pat. No. 5,102,495, which is a continuation of application No. 07/443,039, Dec. 1, 1989, Pat. No. 5,013,385, which is a continuation of application No. 07/115,774, Oct. 30, 1987, abandoned, which is a continuation of application No. 06/923,125, Oct. 24, 1986, Pat. No. 4,715,921, and a continuation-in-part of application No. 06/853,775, Apr. 18, 1986, abandoned.

[51] Int. Cl.[7] .................................................. H01L 21/00
[52] U.S. Cl. ............................................................ 156/345
[58] Field of Search ............................ 156/643.1, 646.1, 156/345 P; 204/192.32, 192.35, 192.37, 298.31, 298.16; 216/67, 2; 438/710

[56] References Cited

U.S. PATENT DOCUMENTS

| | | | |
|---|---|---|---|
| D. 275,032 | 8/1984 | Maher, Jr. et al. | D24/1.1 |
| 3,765,763 | 10/1973 | Nygaard . | |
| 3,973,665 | 8/1976 | Giammanco | 198/19 |
| 4,094,722 | 6/1978 | Yamamoto et al. | 156/345 |
| 4,149,923 | 4/1979 | Uehara et al. | 156/345 |

(List continued on next page.)

FOREIGN PATENT DOCUMENTS

| | | |
|---|---|---|
| 0165400 | 12/1985 | European Pat. Off. . |
| 0272141 | 6/1988 | European Pat. Off. . |
| 55-141570 | 11/1980 | Japan . |
| 56-35743 | 12/1981 | Japan . |
| 57-149748 | 9/1982 | Japan . |
| 57-202733 | 12/1982 | Japan . |
| 58-200529 | 11/1983 | Japan . |
| 60-6224 | 1/1985 | Japan . |
| 60-167420 | 8/1985 | Japan . |
| 60-238134 | 11/1985 | Japan ................................. 156/345 |
| 61-39519 | 2/1986 | Japan . |
| 62-295421 | 12/1987 | Japan . |
| 2156451 | 10/1985 | United Kingdom . |
| 2171978 | 9/1986 | United Kingdom . |
| WO 8704414 | 7/1987 | WIPO . |
| WO 87/06561 | 11/1987 | WIPO . |

OTHER PUBLICATIONS

Chapman, B., "Glow Discharge Processes—Sputtering and Plasma Etching," *Plasma Etching*, John Wiley & Sons, Inc., NY, 1980, pp. 326–329.

"Dry Etching Systems," Semiconductor International, Oct. 1985, pp. 49–60.

Drytek Brochure entitled "Quad Systems," Drytek Inc. 1985, consisting of 11 pages of advertisement, published by Drytek, Inc., 16 Jonspin Road, Wilmington, MA 01887.

(List continued on next page.)

*Primary Examiner*—William Powell

[57] ABSTRACT

A substrate processing system is provided that includes substrate processing vessels, a substrate queuing station, a substrate transfer device, and a processor. The processor, in communication with the processing vessels, the queuing station, and the transfer device, provides selectable single and multi-step processing of the substrates by accessing a process command for a given substrate corresponding to desired processing of the substrate.

9 Claims, 15 Drawing Sheets

U.S. PATENT DOCUMENTS

| | | | |
|---|---|---|---|
| 4,208,159 | 6/1980 | Uehara et al. | 414/225 |
| 4,264,706 | 4/1981 | Sutton et al. | 430/274 |
| 4,311,427 | 1/1982 | Coad et al. | 414/217 |
| 4,318,767 | 3/1982 | Hijikata et al. | 156/345 |
| 4,381,965 | 5/1983 | Maher, Jr. et al. | 156/345 |
| 4,405,435 | 9/1983 | Tateishi et al. | 204/298 |
| 4,473,435 | 9/1984 | Zafiropoulo et al. | 156/643 |
| 4,477,311 | 10/1984 | Mimura et al. | 156/643 |
| 4,483,651 | 11/1984 | Nakane et al. | 414/217 |
| 4,498,416 | 2/1985 | Bouchaib | 118/719 |
| 4,534,314 | 8/1985 | Ackley | 118/733 |
| 4,542,712 | 9/1985 | Sato et al. | 118/726 |
| 4,547,247 | 10/1985 | Warenback et al. | 156/345 |
| 4,548,699 | 10/1985 | Hutchinson et al. | 204/298 |
| 4,550,239 | 10/1985 | Uehara et al. | 219/121 PG |
| 4,560,462 | 12/1985 | Radford et al. | 204/298 |
| 4,563,240 | 1/1986 | Shibata et al. | 156/643 |
| 4,584,045 | 4/1986 | Richards | 156/345 |
| 4,587,002 | 5/1986 | Bok | 204/298 |
| 4,592,306 | 6/1986 | Gallego | 118/719 |
| 4,622,918 | 11/1986 | Bok | 118/718 |
| 4,650,064 | 3/1987 | Slabaugh | 198/631 |
| 4,657,618 | 4/1987 | Spencer et al. | 156/345 |
| 4,661,196 | 4/1987 | Hockersmith et al. | 156/345 |
| 4,661,228 | 4/1987 | Mintz | 204/192.25 |
| 4,664,062 | 5/1987 | Kamohara et al. | 118/719 |
| 4,668,338 | 5/1987 | Maydan et al. | 156/643 |
| 4,668,365 | 5/1987 | Foster et al. | 204/192.23 |
| 4,670,126 | 6/1987 | Messer et al. | 204/298 |
| 4,674,621 | 6/1987 | Takahashi | 198/378 |
| 4,675,096 | 6/1987 | Tateishi et al. | 204/298 |
| 4,705,951 | 11/1987 | Layman et al. | 250/442.1 |
| 4,713,551 | 12/1987 | Layman et al. | 250/561 |
| 4,715,764 | 12/1987 | Hutchinson | 414/217 |
| 4,715,921 | 12/1987 | Maher et al. | 156/345 |
| 4,717,461 | 1/1988 | Strahl et al. | 204/192.1 |
| 4,724,621 | 2/1988 | Hobson et al. | 34/218 |
| 4,756,815 | 7/1988 | Turner et al. | 204/298 |
| 4,763,602 | 8/1988 | Madan et al. | 118/719 |
| 4,770,590 | 9/1988 | Hugues et al. | 414/172 |
| 4,775,281 | 10/1988 | Prentakis | 414/416 |
| 4,776,918 | 10/1988 | Otsubo et al. | 156/345 |
| 4,825,808 | 5/1989 | Takahashi et al. | 118/719 |
| 4,851,101 | 7/1989 | Hutchinson | 204/298 |
| 4,852,516 | 8/1989 | Rubin et al. | 118/715 |
| 4,909,695 | 3/1990 | Hurwitt et al. | 414/217 |
| 4,951,601 | 8/1990 | Maydan et al. | 118/719 |
| 5,013,385 | 5/1991 | Maher et al. | 156/345 |
| 5,013,400 | 5/1991 | Kurasaki et al. | 156/643 |
| 5,076,205 | 12/1991 | Vowles et al. | 118/719 |
| 5,308,431 | 5/1994 | Maher et al. | 156/345 |

OTHER PUBLICATIONS

Horiike, Y., "Emerging Etching Techniques," *VLSI Electronics Microstructure Science,* vol. 8, Academic Press, Inc. (Harcourt Brace Jovanovich, Publishers), 1984, pp. 448–450.

IBM Technical Disclosure Bulletin, vol. 29, No. 1, Jun. 29, 1986, entitled "Vacuum–Compatible Wafer Handler."

Itakura, H., Komiya, H., and Ukai, K., "Multi–Chamber Dry Etching System," *Solid State Technology,* Apr. 1982, pp. 209–214.

Maher, Jr., J.A., "Plasma Etching of Aluminum and Its Alloys," LFE Corporation, Process Control Div., 1601 Trapelo Rd., Waltham, MA 02154, believed to have been published as an application note in 1978–1979 and presented.

Moleshi, M.M.; Fu, C.Y.; Sigmon, T.W.; and Saraswat, K.C., "Low–temperature direct nitridation of silicon in nitrogen plasma generated by microwave discharge," *J. Appl. Phys.* 58 (6), Sep. 15, 1985, pp. 2416–2419.

Declaration of Mr. Mark W. Miller dated Dec. 21, 1989, filed in appl. S/N 07/115,774 consisting of 9 pages of Declaration and 30 pages of enclosures to the Declaration.

Ulvac Corporation, "Sputtering Systems, Dry Etching Systems and Its Applications" (believed to have been published in 1983).

Semiconductor International, "Contents", vol. 8, No. 10, Oct., 1985.

Plasma Industry Service, Synopsis Report, Salzer Technology Enterprises Inc., Dec., 1983.

Tegal, Detailed Technical Specifications.

Lavine, R.E., "Thin Film Sputtering Improved by Handling Disks Individually", *Vacuum Technology Research and Division,* Mar. 1985, pp. 111–115.

Brooks Automation, Wafer Handling Products (date unknown and not admitted to be prior art).

"Automated Wafer Processing", SME Technical Paper, EMTAS '84 Conference Oct. 9–11, 1984, by J. Gililland, pp. 1–7, 1984.

"Wafer Fabrication and Process Automation Research at Stanford University", Solid State Technology, by B.K. Reid, et al., pp. 126–132, Jul. 1984.

"Computer Automated IC Manufacturing Demands ULSI Wafers", Solid State Technology, by H.R. Huff, et al., pp. 193–194, Sep. 1985.

"Processing and Device Technology Advancements", IEEE International Solid–State Circuits Conference, by Ning–Gau Wu, pp. 208–209, Feb. 15, 1980.

Fully Automated LSI Fabrication Technology Using Wafer Cassette Transportation System, IEEE Service Cent. (Cat. No. 82CH1822–6), by M. Miyake, et al., pp. 66–67, 1982.

"Automated Semiconductor Line Speeds Custom Chip Production", Electronics, by R.Burnner, et al. vol. 54, No. 2, pp. 121–127, Jan. 27, 1981.

"Computer–Aided LSI Circuit Manufacturing Process Control", IEEE, by E.George Smith, pp. 248–250, 1980.

"The One–Month Chip: Fabrication", IEEE Spectrum, by M.A. Fischetti, vol. 21, No. 9, pp. 35–39, Sep. 1984.

"Casey Jones Would Have Manufactured His IC Devices This Way", Industrial Research, by P.G. Borden, et al., vol. 25, p. 99, Jul. 1983.

"Gear Cos. Inch to Integrated Fab Lines in Anti–Contaminant Drive", Electronic News, by Mark Mehler, vol. 29, p. 1, May 30, 1983.

"Backed by Significant Venture Capital, Chip Start–Ups Flourish", Computerworld, Aug. 27, 1984.

"Automated Semiconductor Line Speeds Custom Chip Production", Electronics, Jan. 27, 1981, International Edition.

"Automatic Microprocessor Control of Continuous In–Line Aluminum Deposition on Silicon Wafers", American Inst. Chem. Engrs., New York, NY, by M.M. Kuljian, pp. 266–270, 1979.

"Advances in Wafer Process Control", Solid State Technology, by K. Schuegraf, vol. 23, No. 2, pp. 87–94, Feb. 1980.

"Automated Semiconductor Vacuum Chemical Vapor Deposition Facility (Final Report)", NTIS Accession Number: N82–2058/1, 9 pgs., 1982.

"Wafer Handling Robot", Solid State Technology, vol. 28, No. 1, p. 74 Jan. 1985.

"Automation in Semiconductor Manufacturing", IEEE Proceedings of the International Electron Devices Meeting, by T. Makimoto, et al., pp. 11–15, 1982.

"Automation of Front–End Processing Equipment for VLSI Fabrication, "Semicon/West Technical Proceedings, pp. 99–105, 1983.

The System 1000, The Semi Group RIE System 100 TC, 6 pages, believed to be published sometime before Mar., 1985, printed in California and available as a machine data sheet in the United States.

GIR 200, Plasma Cassette to Cassette R.I.E.–Planar Plasma Etcher, CIT Alcatel, 10 pages, believed to be published sometime before Feb., 1984, printed in France and available as a machine data sheet in the United States.

Omni–Etch 10000 Dry Processing System, Perkin–elmer, 8 pages, dated Sep., 1982, available as a machine data sheet in the United States.

Vactronic PDS–5000 Distributed Multichamber Plasma Processing System, 4 pages, believed to be available sometime in 1981, printed in New York and available as a machine data sheet in the United States.

AutoEtch 480 . . . , 3 pages, believed to be published by Apr., 1982, and available as a machine data sheet in the United States.

Reactive Ion Etching Parameters, Anelva, 4 pages, dated Jan., 1981, printed in California and available as a machine data sheet in the United States.

Single Wafer, High Throughput Plasma Inline 801 Polysilicon and Nitride Etcher, Tegal Corp., 4 pages, Oct. 24, 1983, press release.

Plasma Inline 803 Oxide Dry Etcher, Tegal Corp., 5 pages, dated 1983, printed in California and available as a machine data sheet in the United States.

5000 Planar Etcher, Dionex, 4 pages, Bulletin No. 5000, dated 1979, printed in California and available as a machine data sheet in the United States.

Dionex 5400: Programmable Planar System, 4 pages, Bulletion No. 5400, dated 1979, printed in California and available as a machine data sheet in the United States.

1521, Cassette–to–cassette RIE/plasma production etcher, Tegal Corp., 1 page, apparently dated Apr. 27, 1984, printed in California and available as a machine data sheet in the United States.

1522, Cassette–to–cassette RIE/plasma production etcher, Tegal Corp., 1 page, apparently dated Apr. 27, 1984, printed in California and available as a machine data sheet in the United States.

Sputtering Systems, Dry Etching Systems and Its Applications, Ulvac Corp., 24 pages, dated sometime in 1983, printed in Japan and available as a machine data sheet in the United States.

Fundamentals of Plasma–Etching, Dionex, 8 pages, Bulletin No. 70001, dated 1979, printed in California and available as a machine data sheet in the United States.

Series 5400SCC Cassette–to–Cassette Planar Etcher, Dionex, 2 pages, Bulletin No. 5400SCC, dated 1978, printed in California and available as a machine data sheet in the United States.

F. Engle, "The Multiple Modular–Unit Alternative for Wafer Processing", *Microelectronic Manufacturing And Testing*, Mar. 1982, pp. 9–11.

D.K. Lam, "Advances in VLSI Plasma Etching", *Solid State Technology*, Apr. 1982, 5 pages.

"Plasma–Sette System, Broader Applications with Good Competitive Results," *Airco Temescal Technical Service Bulletin*, No. 83–1, Mar. 4, 1983, pp. 1–9.

Cassette–to–Cassette Load–Lock Plasma/RIE System Plasma Sette II, Temescal, 12 pages, dated May, 1983, printed in California and available as a machine data sheet in the United States.

"3–D Interconnect Technologies for VLSI Devices: Dry Processing," Strategic Inc., Feb. 1984, pp. 1–143.

The IPC 6420 Aluminum Etching System, Branson/IPC, 11 pages, believed to be available before Feb. 1984, printed in California and available as a machine data sheet in the United States.

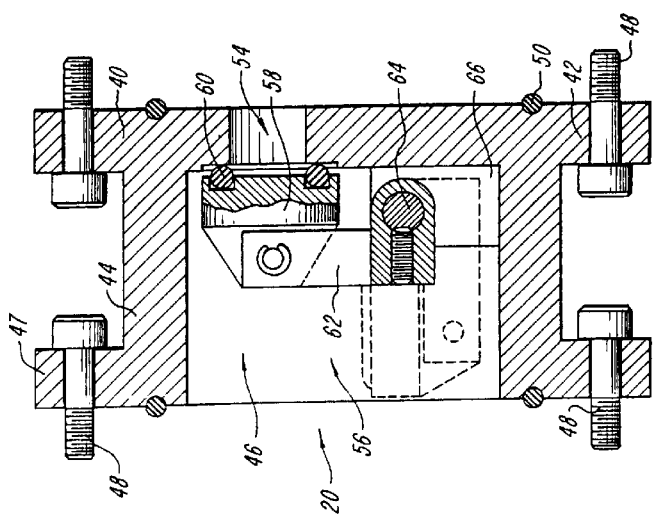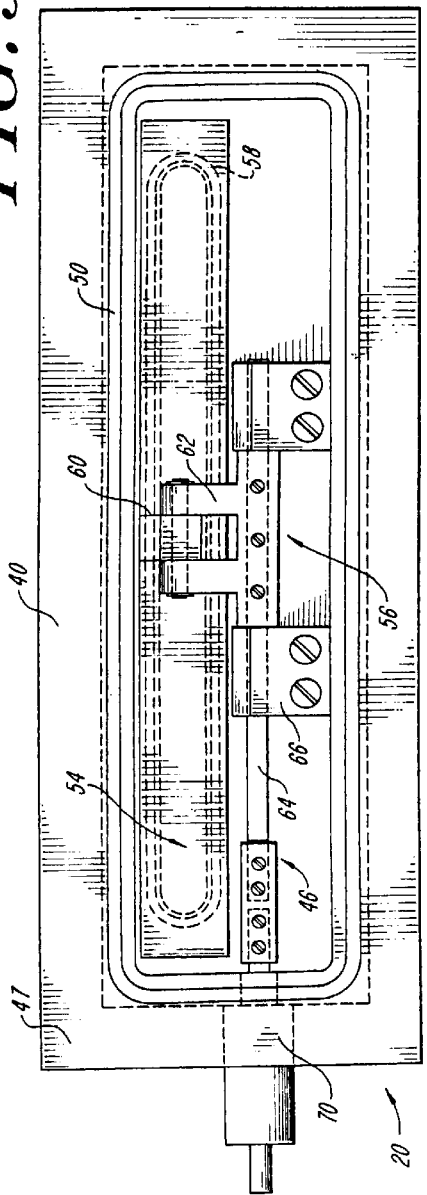

SYSTEM FOR PROCESSING SUBSTRATES

This is a continuation application under §1.62 of prior application Ser. No. 08/234,312, filed Apr. 28, 1994 now abandoned, entitled: SYSTEM FOR PROCESSING SUBSTRATES; which is a continuation of Ser. No. 07/863,723, Apr. 3, 1992, U.S. Pat. No. 5,308,431; which is a continuation of Ser. No. 07/689,357, Apr. 22, 1991, U.S. Pat. No. 5,102,495; which is a continuation of Ser. No. 07/443,039, Dec. 1, 1989, U.S. Pat. No. 5,013,385; which is a continuation of Ser. No. 07/115,774, Oct. 30, 1987, abandoned; which is a continuation of Ser. No. 06/923,125, Oct. 24, 1986, U.S. Pat. No. 4,715,921, and a continuation-in-part. of Ser. No. 06/853,775, Apr. 18, 1986, abandoned.

FIELD OF THE INVENTION

This invention is directed to the field os semiconductor processing, and more particularly, to a novel multiple-processing and contamination-free plasma etching system.

BACKGROUND OF THE INVENTION

Plasma etching devices are commonly employed during one or more of the phases of the integrated circuit fabrication process, and are typically available in either a single-wafer or a plural-wafer configuration. The single-wafer configurations, while providing excellent process control, suffer from a restricted system throughput capability. Efforts to relieve the throughput limitations, have been generally unsuccessful. For these high-temperature etching processes, system utility is limited due to the undesirable phenomenon of resist "popping", notwithstanding that various cooling approaches have been used including clamping, cooling of the wafer underside with a helium flow, and the mixing of helium into the plasma. The multiple-wafer configurations, while providing a comparatively much-greater system throughput, have been generally subject to less-than-desirable process and quality control. Not only are end-point determinations for each of the multiple wafers either not available or not precisely determinable, but also electrode positional accuracy for different electrode gaps and correspondingly different gas chemistries is often difficult to establish and maintain. The single-wafer and the multiple-wafer configurations are both subject to the further disadvantage that two or more step processes typically expose the wafers to an undesirable environment in the intermediate handling step, which materially increases the possibility of wafer contamination, and which further restricts the processing throughput.

SUMMARY OF THE INVENTION

The present invention contemplates plural single-wafer plasma reactors each operative individually to provide excellent process control of single wafers, collectively operative to provide a system throughput limited only by the number of the plural plasma reactors, and so cooperative with a common wafer transfer and queuing means as to provide both single-step and multiple-step wafer processing in a manner that neither exposes the wafers to an undesirable atmosphere not to human handling.

In the preferred embodiment, plural plasma reactors and cassette elevator are symmetrically arrayed about an X, TT movable wafer arm assembly. The plural reactors, the cassette elevator, and the X, TT movable wafer arm are maintained in a controlled vacuum condition, and the central S, TT movable wafer arm is in radial communication with the peripherally surrounding plasma reactors and cassette elevator via a corresponding one of a plurality of vacuum lock valves. The arm of the R, TT movable wafer arm assembly includes an apertured platform for supporting each wafer, and a cooperative bumper for releasably engaging the back and the periphery of the supported wafer without any wafer front surface contact. Plural wafer contact responsive sensors mounted to the platform are operative to provide a signal indication of whether or not the wafer is in a properly seated condition. Each of the plural plasma reactors includes a stationary bottom electrode and a movable upper electrode that are cooperative to provide a variable wafer-cathode to anode gap therebetween of a selectable dimension. In one embodiment, a support assembly including a micrometer adjustment stop is provided for selectively positioning the movable electrode, and in another embodiment, a combination micrometer stop and pneumatic actuators are provided for selectively positioning the movable electrode. A vertically movable pedestal is slidably mounted centrally to the stationary electrode of each of the plural plasma reactors that cooperates with the apertured platform of the R, TT movable wafer arm assembly to load and unload the wafers respectively onto and off of the stationary electrode. A reactant gas injection system, a RF power source, and an end-point determination means are operatively coupled to each of the plural plasma reactors. The plural plasma reactors are operable in either embodiment to run the same or different processes, and are cooperative with the R, TT movable wafer arm assembly to provide one of the same single-step processing simultaneously in the plural plasma reactors, different single-step processing simultaneously in the plural plasma reactors, and sequential two or more step processing in the plural reactors. Two embodiments of the R, TT movable wafer arm assembly are disclosed.

BRIEF DESCRIPTION OF THE DRAWINGS

These are other features, and advantages, of the present invention will become apparent as the invention becomes better understood by referring to the following solely-exemplary and non-limiting detailed description of the preferred embodiments thereof, and to the drawings, wherein:

FIG. 3 illustrates in FIG. 3A and in FIG. 3B partially schematic side and end elevational views respectively illustrating the vacuum locks intermediate a corresponding plasma reactor and the R, TT movable arm assembly of the multiple-processing and contamination-free plasma etching system according to the present invention;

DETAILED DESCRIPTION OF THE PREFERRED EMBODIMENT

Figure 1:
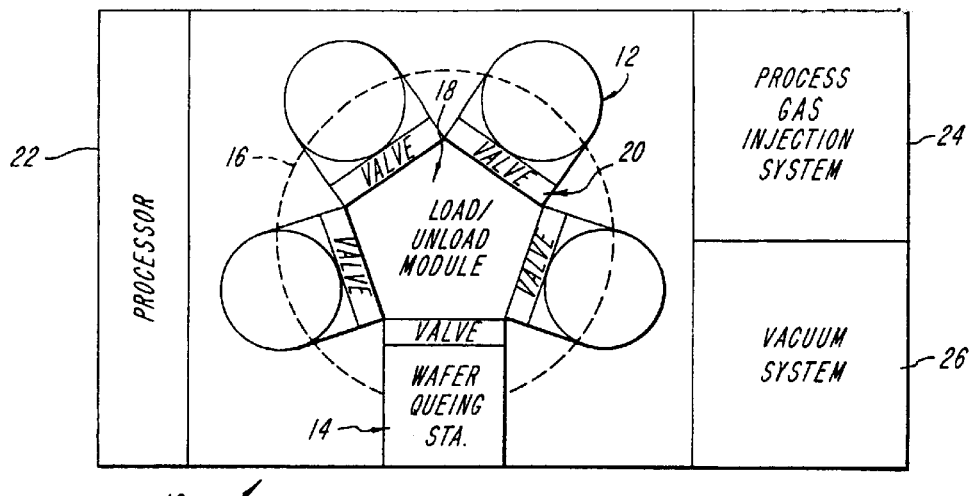
FIG. 1 is a pictorial diagram illustrating the multiple-processing and contamination-free plasma etching system according to the present invention.

Referring now to FIG. 1, generally designated at 10 is a pictorial diagram illustrating the multiple-processing and contamination-free plasma etching system according to the present invention. The system 10 includes a plurality of single-wafer plasma reactors generally designated 12 to be described and a wafer queuing station generally designated 14 to be described that are arrayed about a closed locus as illustrated by a dashed line 16. A load/unload module generally designated 18 to be described is disposed concentrically within the plural plasma reactors 12 and the queuing station 14 for singly transferring wafers to be processed and after processing between the queuing station 14 and one or more of the plasma reactors 12. A plurality of vacuum locks generally designated 20 to be described are individually provided at the interfaces of the several plasma reactors 12 and the load and unload module 18, and between the interface of the queuing station 14 and the load and unload module 18. A processor 22 is operatively coupled to the plural plasma reactors 12, to the queuing station 14, and to the load and unload module 18 for activating and de-energizing radio frequency plasma inducing fields in well-known manner, for controlling and processing in well-known manner the signal output of end-point determination means coupled to the several plasma reactors, and for initiating and coordinating wafer transfer between the several reactors and the queuing station to be described.

A reactant gas injection system 24 to be described is operatively coupled to the plural plasma reactors 12 for controllably injecting preselected reactants and other process gases severally into the plural plasma reactors. A vacuum system 26 is operatively coupled to the reactors 12, to the queuing station 14, and to the load and unload module 18 for maintaining the entire assembly at a controlled vacuum condition during operation. The process 22 is operatively coupled to the reactant gas injection system and to the vacuum system 26.

The several reactors 12, the queuing station 14, and the concentric load and unload module 18 conserve space utilization and in such a way as to provide a comparatively-compact plasma etching system. The load and unload module 18 and cooperative ones of the vacuum locks 20 are operable to transfer wafers singly between the queuing station 14 and selected reactors 12 in a single-step processing mode and between selected reactors 12 in a two or more step processing mode without any residual or environmentally-induced wafer contamination as well as without intermediate operator handling. Among other additional advantages, the plasma etching system of the present invention is characterized by both an excellent process control and a high processing throughput, the mutual coexistence of both features having not heretofore been possible in a practicable embodiment.

Figure 2:
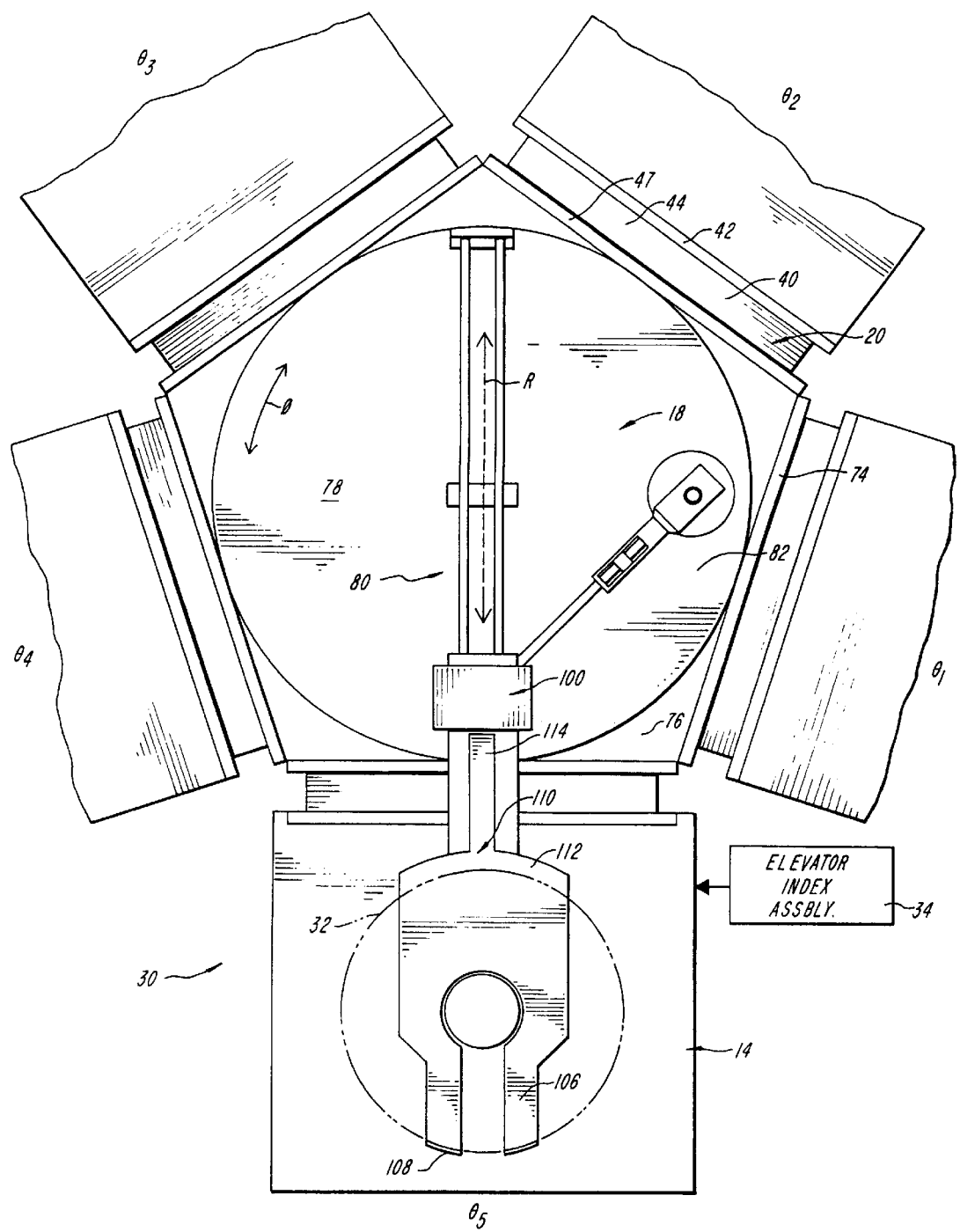
FIG. 2 is a fragmentary plan view, partially broken away, of the multiple-processing and contamination-free plasma etching system according to the present invention.

Referring now to FIG. 2, generally designated at 30 is a fragmentary plan view, partially broken-away, illustrating the multiple-processing and contamination-free plasma etching system of the present invention. The queuing station 14 preferably includes a cassette, not shown, having plural vertically-spaced wafers 32 stacked therein. The cassette is preferably mounted for vertical stepping motion by an indexed elevator assembly schematically illustrated at 34, that is operable under control of the processor 22 (FIG. 1) to step the cassette in vertical increments that correspond to the spacing of the vertically spaced wafers for addressing the associated cassette slot position. It will be appreciated that in this way individual wafers in the cassette are addressed for removal for processing and for return after processing to their corresponding slot positions. It should be noted that although a cassette and indexed elevator assembly are presently preferred, any other suitable wafer queuing station can be employed as well without departing from the inventive concept.

Referring now to FIGS. 2, 3A and 3B, the vacuum locks 20 intermediate the queuing station 14 and the load/unload module 18 and intermediate the plural plasma reactors 12 and the load and unload station 18 each include a housing body generally designated 40. The housing 40 includes a plate 42 having opposing top, bottom, and side walls 44 orthogonal thereto that cooperate to define a generally-rectangular hollow generally designated 46 therewithin as best seen in FIG. 3A. A flange 47 is provided peripherally around the walls 44 on the ends thereof remote from the plate 42, and bolts 48 are provided through the ends of the plate 42 and of the flange 47 for fastening the housing body 40 at the interfaces between corresponding ones of the plasma reactors 12 and the load and unload station 18 and between the interface between the queuing station 14 and the load and unload station 18. O-rings 50 are provided on the sealing faces of the plate 42 and flange 47 for providing an air-tight seal. An elongated slot generally designated 54 is provided through the plate 47 that is in communication with the generally-rectangular hollow 46.

A chamber door assembly generally designated 56 is cooperative with the slot 54 to provide a valving, action. The door assembly 56 includes an elongated, generally-rectangular plate 58 of dimensions selected to be larger than the dimensions of the slot 54. An O-ring sealing member 60 is provided in the sealing face of the plate 58 and surrounding the slot 54. The plate 58 is fastened to an arm 62 that is mounted for rotary motion with a shaft 64 journaled in spaced bearings 66 that are fastened to the plate 42. A chamber door TT-drive actuator, not shown, is fastened to the shaft 64 through and edge of the housing 40 preferably via a ferrofluidic or other rotary seal as illustrated dashed at 70.

The chamber door 56 is pivoted by the chamber door TT-drive actuator between an open condition, illustrated in dashed outline in FIG. 3A, and a closed condition, illustrated in solid outline in FIGS. 3A and 3B. In its open condition, the generally rectangular hollow 46 is in open communication with the elongated slot 54, so that a wafer arm assembly to be described may readily be moved therethrough between the load and unload station 18 and the several plasma reactors 12 and the queuing station 14. In the closed condition of the door assembly 56, the load and unload module is sealed from the plural plasma reactors 12 and from the queuing station 18.

Figure 4:
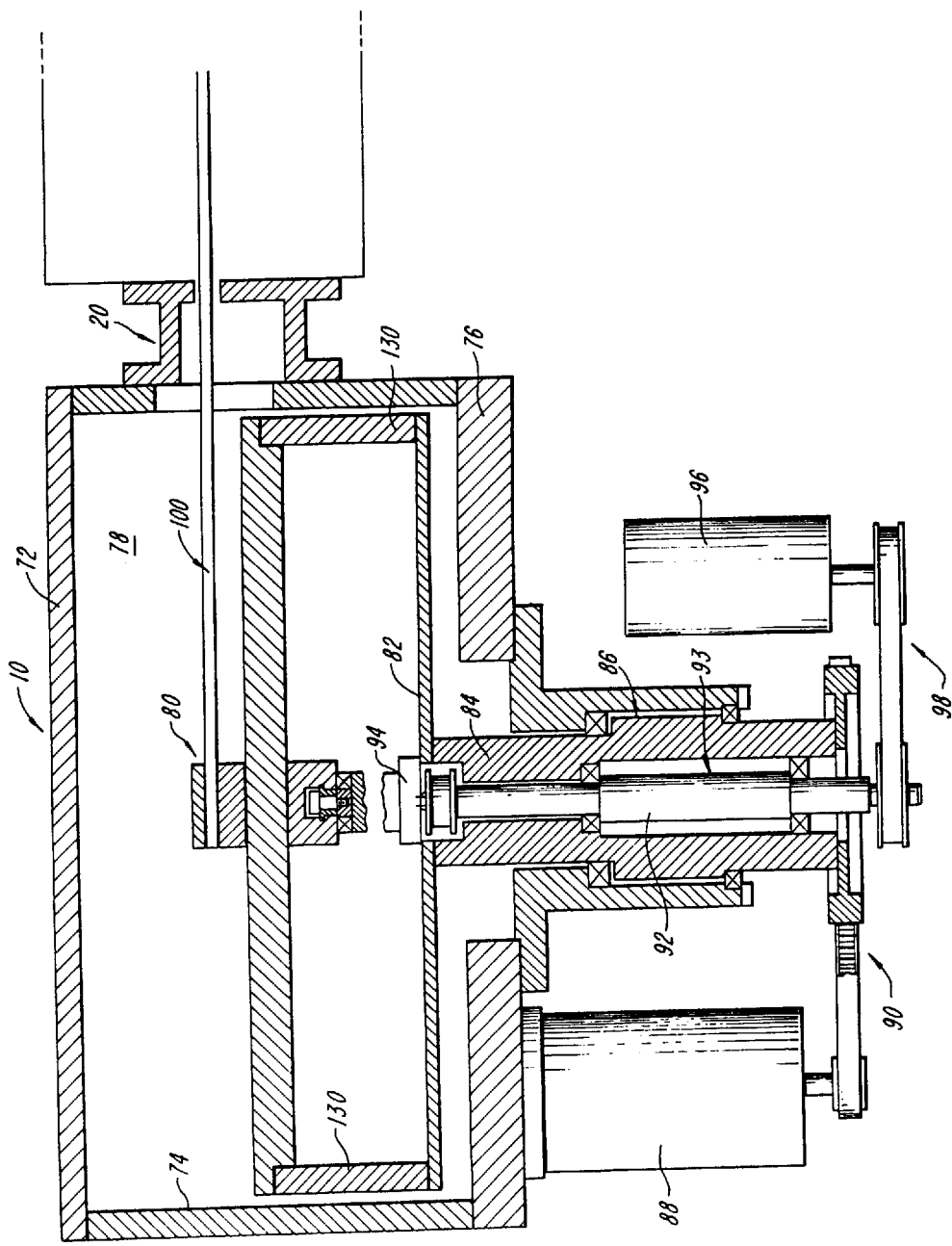
FIG. 4 is a partially pictorial and partially sectional view useful in explaining the operation of the R, TT movable wafer arm assembly of the multiple-processing and contamination-free plasma etching system according to the present invention.

Referring now to FIGS. 2 and 4, the load and unload module 18 includes a top wall 72, pentagonally-arranged side walls 74, and a pentagonal bottom wall 76 defining an enclosure generally designated 78. A R, TT movable wafer arm assembly generally designated 80 to be described is mounted in the enclosure 78. The assembly 80 includes a turntable 82 mounted for TT-rotation with a shaft 84 journaled in a bearing assembly generally designated 86 that is fastened in a central aperture provided therefor in the bottom wall 76. A Theta drive motor 88 mounted to the bottom wall 76 is operatively coupled to the shaft 84 via a belt and wheel arrangement generally designated 90. With controlled rotation of the shaft of the Theta-motor 88, the shaft 84 and therewith the turntable 82 rotates to any selected angular TT orientation for aligning the wafer arm assembly 80 with any one of the plasma reactors 12 or with the queuing station 14 at the corresponding $TT_1$, $TT_2$, $TT_3$, $TT_4$, and $TT_5$ coordinates.

A shaft 92 is concentrically mounted within the shaft 84 and journaled for rotation therein on a bearing and vacuum seal assembly generally designated 93. Any suitable rotary vacuum seal, such as a ferrofluidic rotary vacuum seal, may be employed. On end of the shaft 92 is connected to pivot bearing 94 to be described vacuum-mounted through the turntable 82, and the other end of the shaft 92 is operatively coupled to a R-drive motor 96 via a belt and wheel arrangement generally designated 98. As described more fully below, with the controlled rotation of the shaft of the R-drive motor 96, the wafer arm of both embodiments of the R, TT movable wafer arm assembly to be described is controllably translated in the R-direction for loading and unloading individual wafers into and out of the plural reaction chambers 12 and queuing station 14 through the associated vacuum lock 20.

Figure 5:
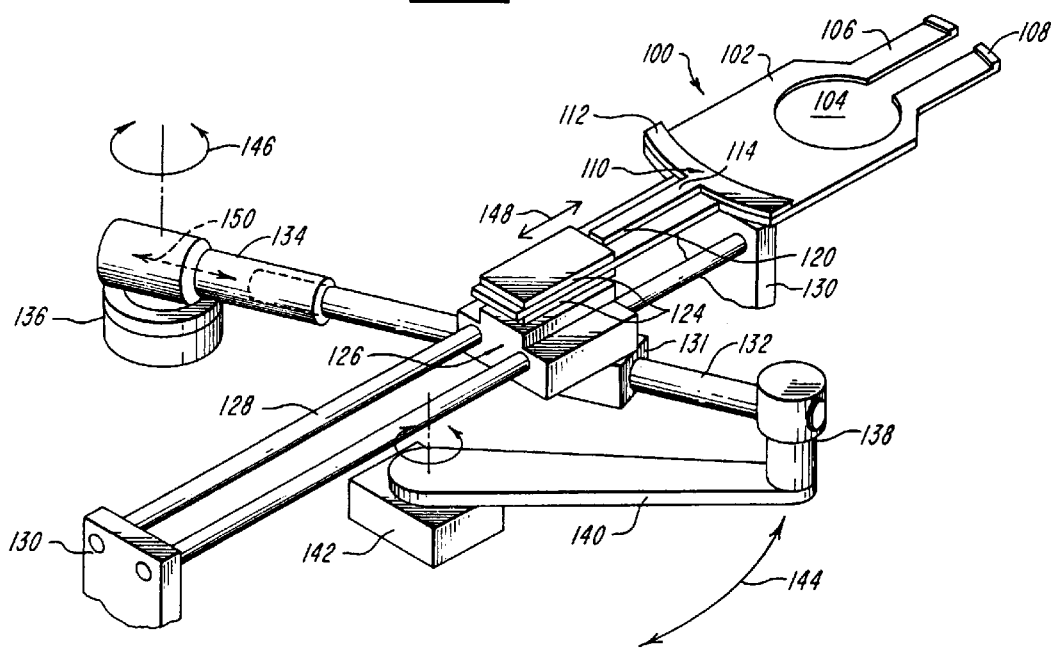
FIG. 5 is a perspective view of a first embodiment of R, TT movable wafer arm assembly of the multiple-processing and contamination-free plasma etching system according to the present invention.
Figure 8:
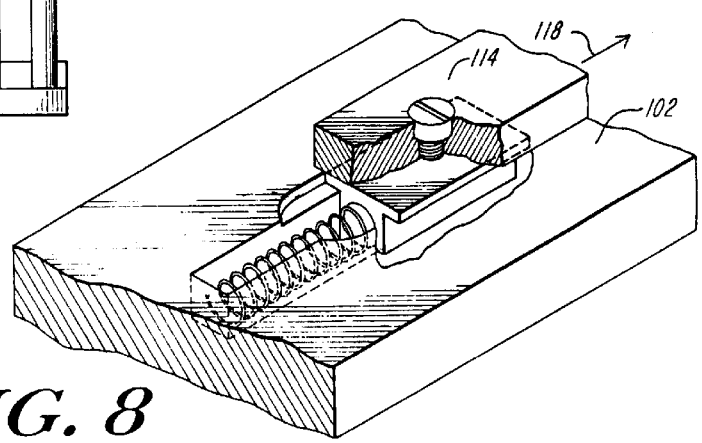
FIG. 8 is a partially broken-away and fragmentary isometric view illustrating a portion of the first embodiment of the R, TT movable arm assembly of the multiple-processing and contamination-free plasma etching system of the present invention.

Referring now to FIGS. 2, 4, and 5, th wafer arm assembly 80 includes a wafer receiving and releasing paddle assembly generally designated 100. The paddle assembly 100 includes a platform 102 having a central opening generally designated 104 therethrough. The member 102 terminated in laterally spaced fingers 106 having wafer-periphery engaging upstanding flanges 108 integrally formed on the free ends thereof. A releasable abutment generally designated 110 having a bumper portion 112 and an integral tail portion 114 is mounted for sliding motion to the platform member 102. As best seen in FIG. 8, a coil spring 116 is mounted between the releasable abutment 110 and the member 102 which urges the bumper 112 in the direction of an arrow 118 so as to abut and therewith frictionally engage the periphery of a wafer, not shown, received between the bumper 112 and the flanges 108. The tail 114 includes a downwardly depending stop 120 to be described that is slidably received in an elongated aperture provided therefor in the platform member 102 that is cooperative with an upstanding abutment to be described to release the frictional wafer engagement as the arm reaches its position of maximum extension. The paddle assembly 100 is mounted between plates 124 to a carriage assembly generally designated 126 that is slidable mounted on linear bearings 128 that are fastened to end posts 130 upstanding from and fastened to the rotatable turntable 82.

The carriage 126 is controllably moved in either direction along the linear bearings 128 for loading and unloading wafers individually to and from the several plasma reactors 12 and the queuing station 18. A member 131 is pivotally mounted subjacent the carriage 126, which houses therein a linear bearing, not shown. A shaft 132 is slidably received through the linear bearing of the pivoting housing 131. One end of the shaft 132 is slidably mounted in a sleeve 134 that is mounted for rotary motion to the turntable 82 via a pivot bearing 136, and the other end of the shaft 132 is fastened to a needle bearing assembly 138 that is pivotally fastened to a crank arm 140 mounted for rotation with the shaft 92 of the R-drive motor 96 (FIG. 4) via a mounting coupling 142 fastened to the turntable 82.

Figure 6:
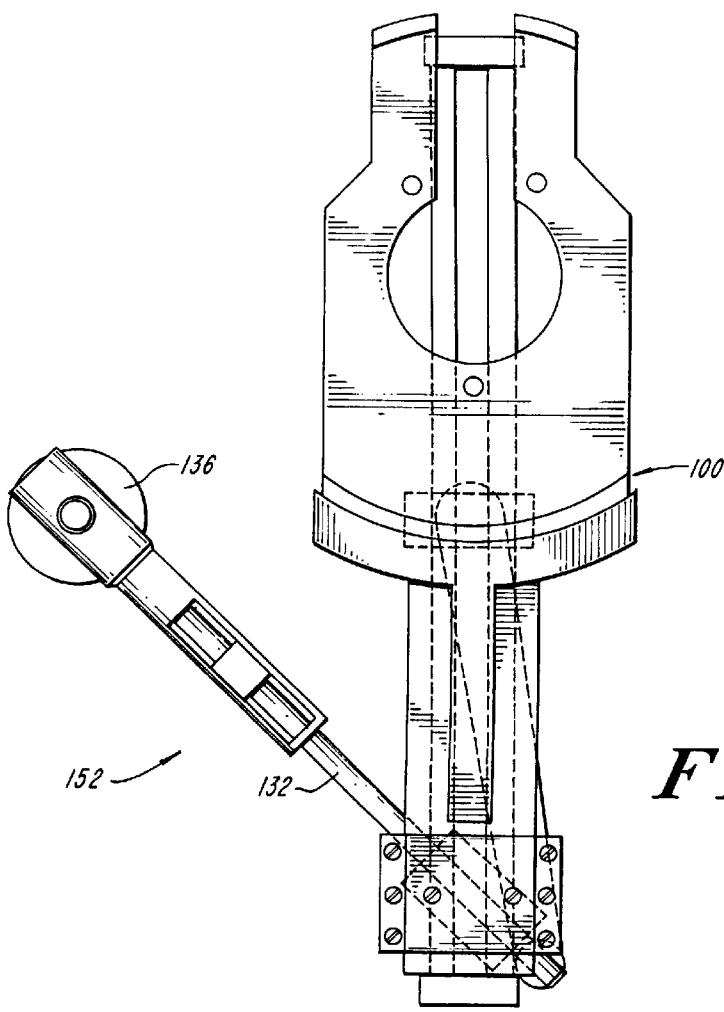
FIGS. 6 and 7 are plan views of the first embodiment of the R, TT movable wafer arm assembly illustrating different movement positions of the R, TT movable wafer arm assembly of the multiple-processing and contamination-free plasma etching system of the present invention.

With controlled rotation of the Theta-drive motor 88, the turntable 82 and therewith the paddle assembly 100 is rotated to that TT coordinate that corresponds to any selected one of the angular locations of the plural plasma reaction chambers designated TT1 through TT4 in FIG. 2, and to that TT coordinate that corresponds to the angular location of the wafer queuing station 14 designated TT5 in FIG. 2. With the controlled rotation of the R-drive motor 96, the crank 140 traces an arcuate path as illustrated by an arrow 144. The arm 132 therewith pivots on the pivot bearing 136 as shown by an arrow 146, and moves the carriage 126 linearly along the bearings 128 in a direction that corresponds to the sense of rotation of the X-drive motor as illustrated by an arrow 148. The arm is either more or less elongated relative to the coupling 136 as it is pivoted by the crank 140, and depending on the sense of the rotation, it slides within the sleeve 134 and within the housing 131 as illustrated by an arrow 150. When the crank 140 is turned to its maximum clockwise position, the paddle assembly 100 moves into its fully retracted position as illustrated generally at 152 in FIG. 6. With counterclockwise motion of the crank arm 140 the paddle moves along the R direction as illustrated generally at 154 in FIG. 7. As the paddle assembly 100 nears its fully extended position, close to the maximum allowed counterclockwise rotation of the R-drive motor, the stop 120 on the tail portion 110 abuts the confronting wall of the upstanding end post 130, such that with continued motion of the paddle along the R direction the bumper 110 draws away from the flanges 108 and thereby releases the frictional engagement of the wafer periphery. In the maximum extended position, then, the wafers are free to be loaded or unloaded to and from any selected plasma reactor 12 and/or are free for pick up or delivery back into the queuing station 14.

Figure 7:
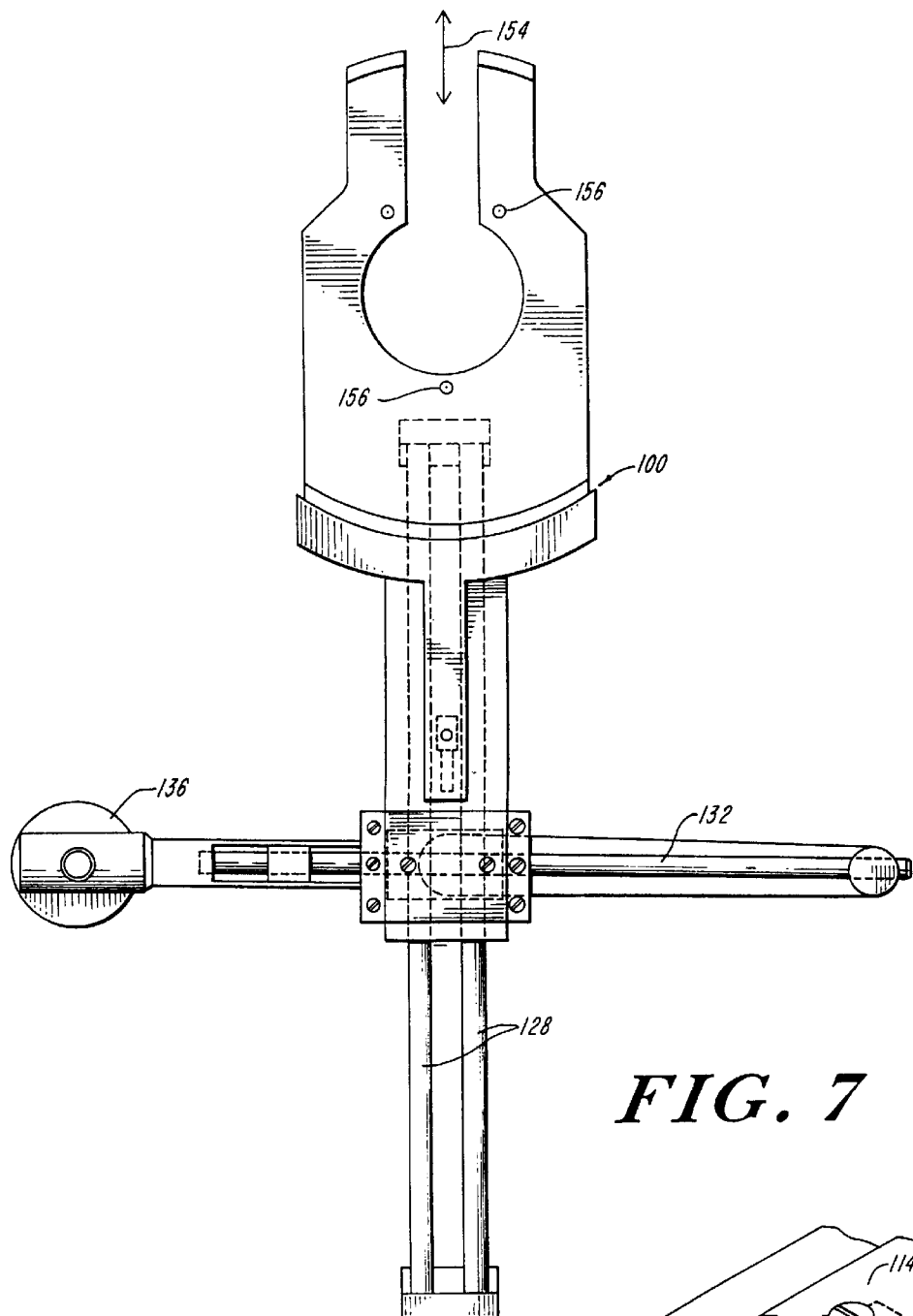

Contacts 156, preferably three in number, are mounted to the platform member 102 of the paddle assembly 100 as shown in FIG. 7. The contacts are operative in response to the presence of a supported wafer to provide a three-point signal indicative of whether or not the wafer is properly seated on the wafer transfer arm. The contacts preferably are formed on a printed circuit board, not shown, mounted to the paddle assembly 100. A different number thereof, or other sensing means may be utilized, so long as an accurate indication of intended seating of individual wafers is provided.

Figure 9:
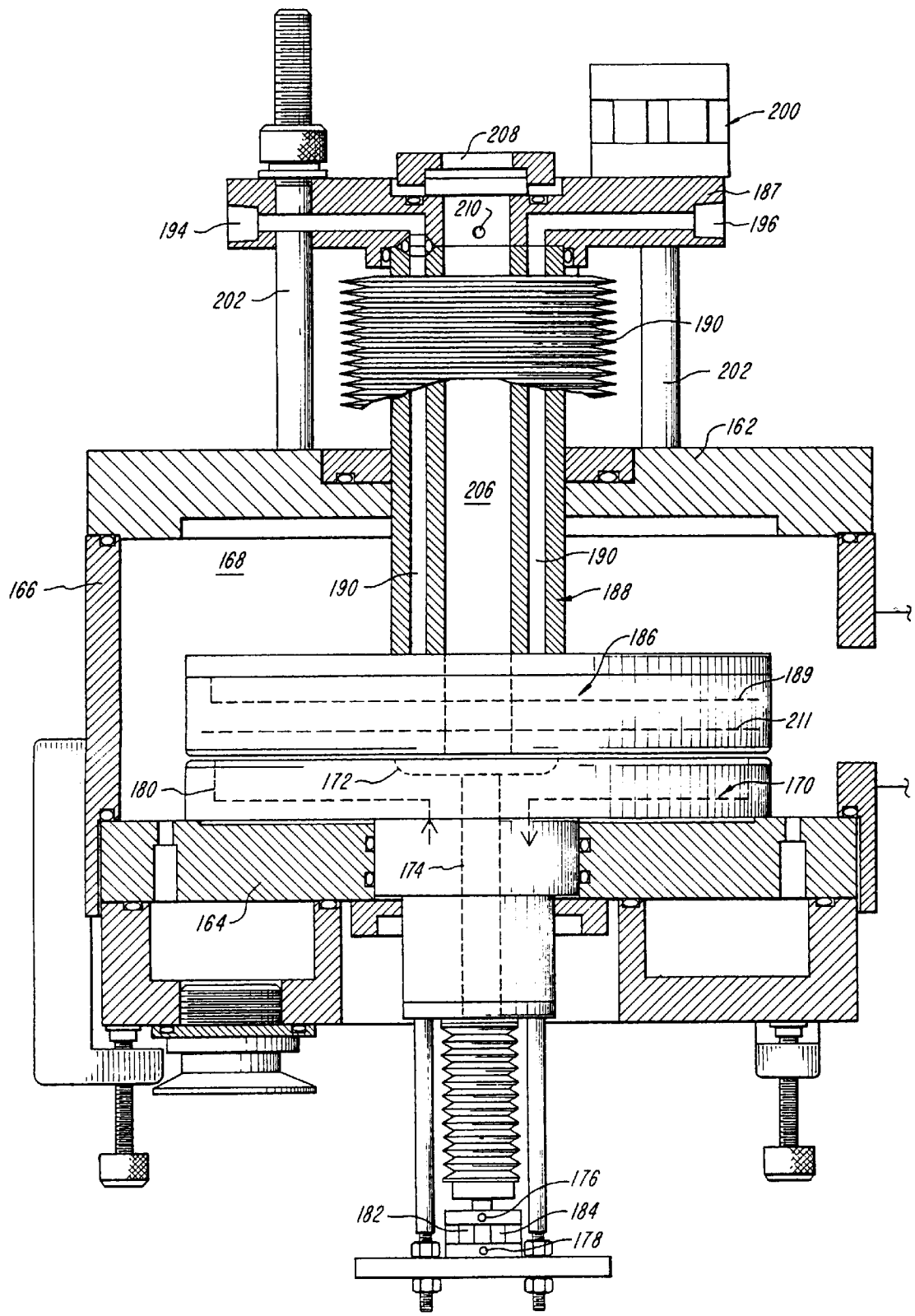
FIG. 9 is a partially pictorial and partially schematic side view illustrating a plasma reactor of the multiple-processing and contamination-free plasma etching system according to the present invention.

Referring now to FIG. 9, generally designated at 160 is a partially pictorial and partially schematic side view illustrating a plasma reactor of the multiple-processing and contamination-free plasma etching system according to the present invention. Each of the plasma reactors 160 includes a top plate 162, a spaced-apart bottom plate 164 and a cylindrical sidewall 166 cooperate to define a plasma chamber generally designated 168. A first electrode generally designated 170 is fastened to the bottom plate 164. A pedestal schematically illustrated dashed at 172 is slidably mounted centrally in the bottom electrode 170 for vertical motion with the shaft of a pnuematic cylinder schematically illustrated in dashed outline 174. As described more fully below, the pedestal 172 is cooperative with the paddle arm assembly to allow for removal and delivery of individual wafers into and out of the plasma chambers. The pedestal pnuematic cylinder 174 is driven by a controlled air supply, not shown, operatively coupled thereto via an air input port 176 and an air output port 178. As illustrated by dashed outline 180, a source of colling liquid, not shown, is coupled to internal fluid flow passageways, not shown, provided through the interior of the bottom electrode 170 via input and output ports 182, 184 for removing the heat produced in the bottom electrode during plasma etching. A top electrode generally designated 186 is fastened to a support shaft generally designated 188 that is slidably received through the top plate 162 in a vacuum-tight sealing engagement therewith as by a stainless steel vacuum bellows 190 fastened between the top plate 162 and a superadjacent shaft support plate 187. The top electrode 186 includes internal cooling/heating fluid flow passageways schematically illustrated in dashed outline 189 that are coupled via fluid flows conduits 190 disposed in the shaft 188 to a source, not shown, via a liquid input port 194 and an output port 196 provided in the plate assembly 187. A pneumatic actuator generally designated 200 having a ram 202 is mounted to the support plate assembly 187. With the ram 202 in its extended position, not shown, the plate 187 moves upwardly, and therewith the shaft 188 and electrode 186 move upwardly and away from the stationary bottom electrode 170. With the ram lowered as shown, micrometer adjustment posts 204 fastened to the plate assembly 187 bear against the top plate 162 and therewith support the top electrode 186 in an intended spaced-apart relation with the bottom electrode 170. The gap between the electrodes is adjustable by changing the length of the micrometer adjustment posts selectively. In the preferred embodiment, between 2/16 inch to 2 inches of gap adjustment is provided.

The shaft 188 has a hollow interior generally designated 206, and a laser window 208 is mounted across the hollow of the shaft 206. The beam of an external laser, not shown, passes through the window and hollow shaft for providing end-point determinations of the plasma etch state. Other end-point determination means, such as a lateral optical detector, may be employed as well without departing from the inventive concept. Reactant gas injection ports 210 are coupled via internal shaft conduits provided therefor, not shown, to a liquid-cooled showerhead gas manifold illustrated in dashed outline 211 in the upper electrode 186. Reactant gas is controllably released therefrom into the plasma reactor, and radio frequency power is applied in the plasma reaction chambers. In an alternative embodiment, the spacing between the electrodes can be preselected for each particular plasma process, and additional micrometers, in place of the pneumatic actuators 200, can advantageously be employed.

Figure 10:
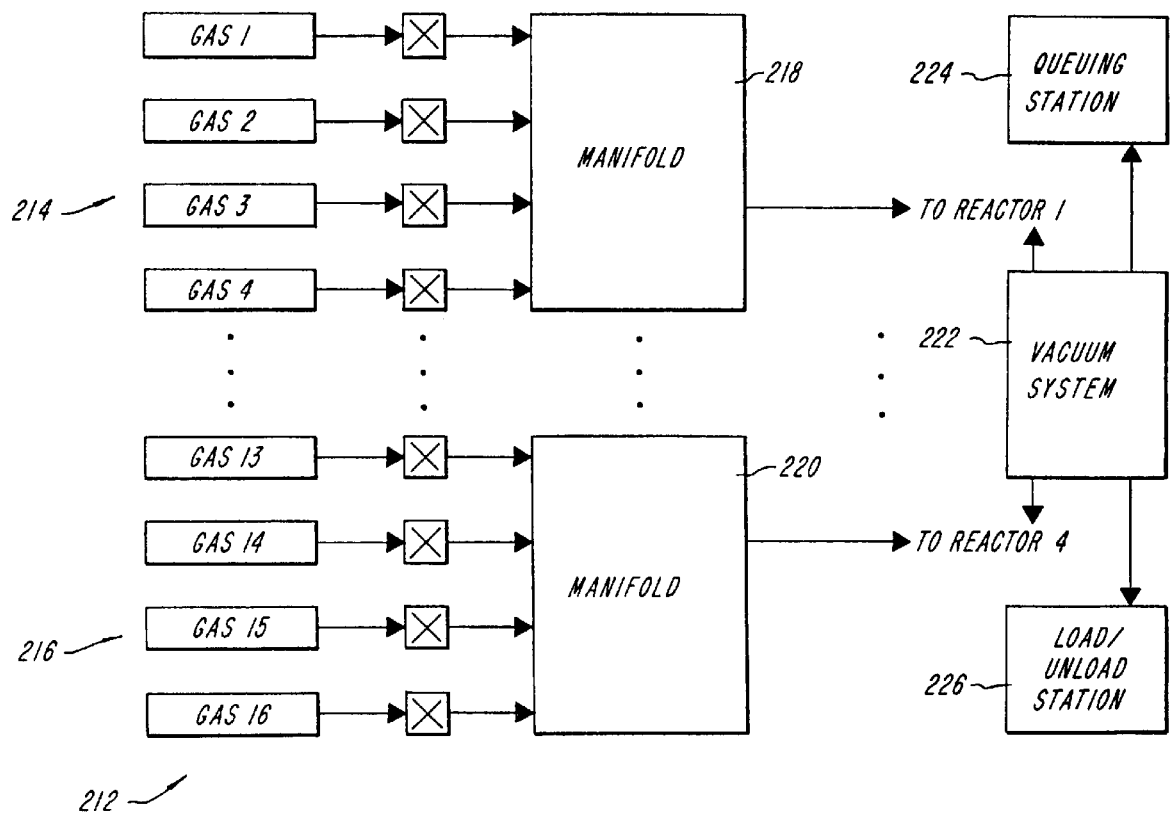
FIG. 10 is a diagramatic view illustrating the several reactant injection systems and controlled vacuum system of the multiple-processing and contamination-free plasma etching system of the present invention.

Referring now to FIG. 10, generally designated at 212 is a schematic diagram illustrating the presently preferred gas injection and controlled vacuum systems. Preferably, four independently valved sources of gases are respectively connected to individual ones of plasma vessels via corresponding ones of a plurality of gas manifolds, two banks of gas sources generally designated 214, 216 and two manifolds 218, 220 being specifically illustrated. A vacuum system 222 is operatively coupled in common to the plural plasma reactor chambers, to the queuing station 224, and to the load and unload island 226. The vacuum system controls the vacuum condition in the entire system, so that the wafers are free from possible contamination as the vacuum locks are severally opened and closed during single and multiple phase processing wafer transfer. It should be noted that while four plasma reactors are disclosed, a greater or a lesser number can be employed without departing from the inventive concept.

Figure 11A:
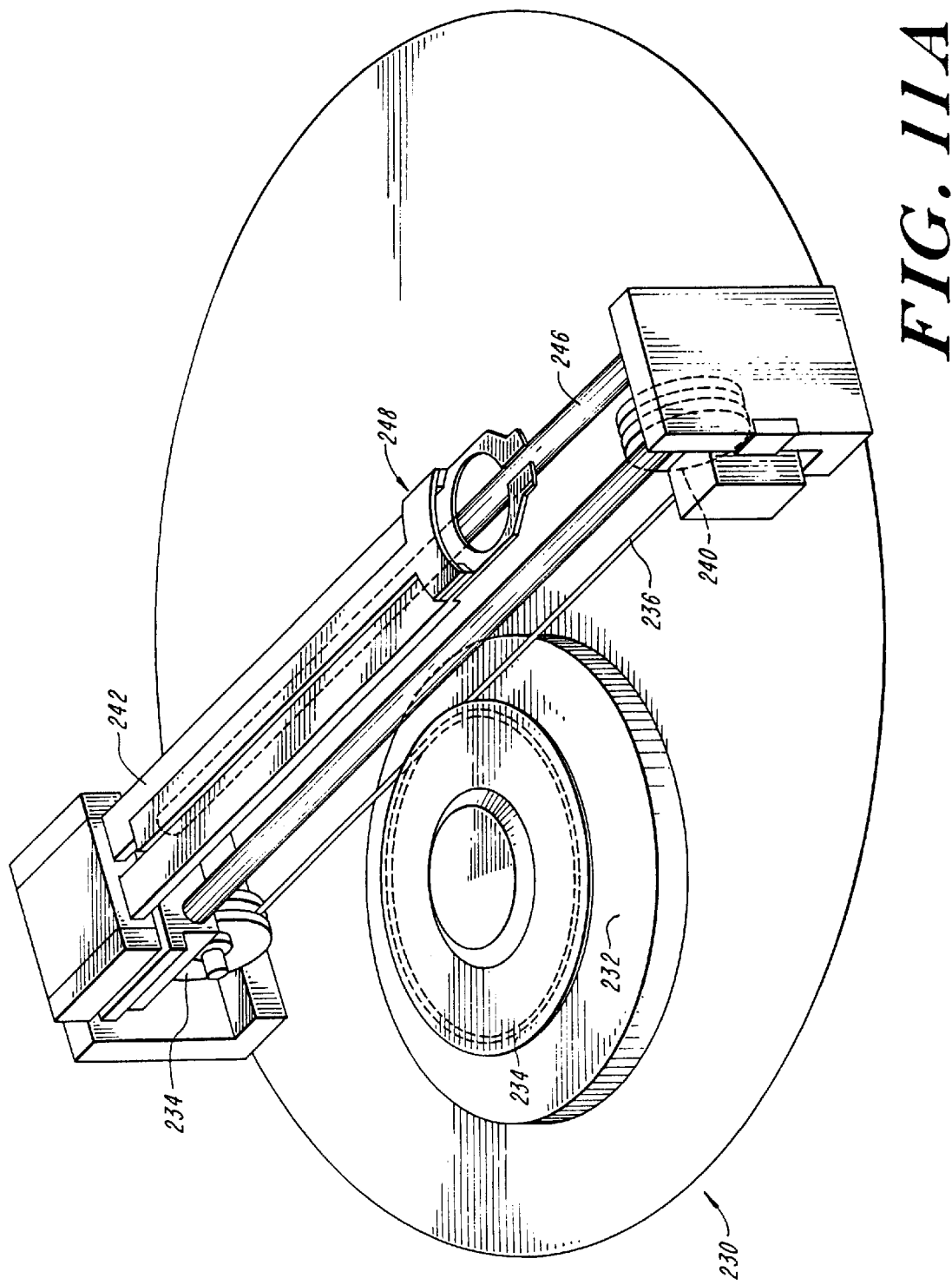
FIG. 11A is a perspective view and FIG. 11B is a sectional view of a second embodiment of the R, TT movable arm assembly of the multiple-processing and contamination-free plasma etching system of the present invention.
Figure 11B:
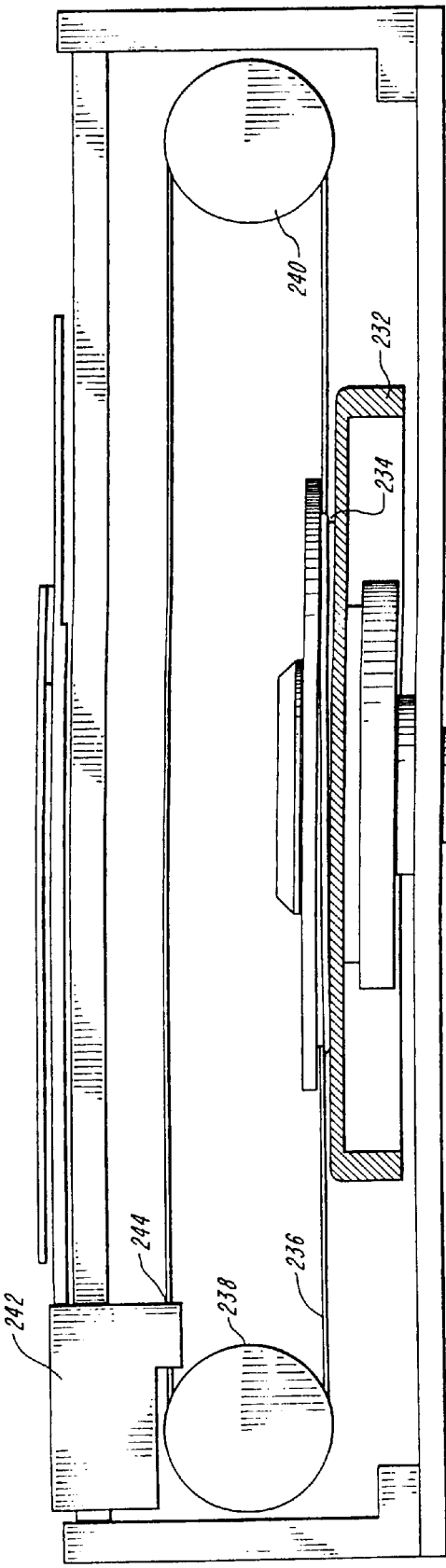
Figure 12:
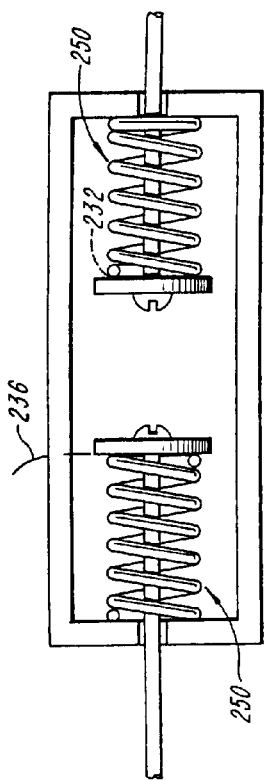
FIG. 12 is a perspective view of a portion of the second embodiment of the R, TT movable wafer arm assembly of the multiple-processing and contamination-free plasma etching system according to the present invention.

Referring now to FIG. 11A, generally designated at 230 is a perspective view of an alternative embodiment of the X. TT wafer arm assembly according to the present invention. The assembly 230 includes a pully 232 mounted for rotation with the shaft of the TT drive motor as best seen in FIG. 11B. The pulley 232 includes a grooved rim 234 around which a cable 236 is wrapped. The cable is drawn tangentially to the grooved rib 234 in opposing directions, and respectively wrapped over pulleys 238, 240 and tied to a slide 242, as best seen at 244 in FIG. 11B. With the angular rotation of the pulley 232, the slide 242 linearly moves along the linear bearings 246. A wafer arm generally designated 248 is mounted for movement with the slide 242 such that the arm 248 is controllably extended and retracted in dependence on the angular position of the pulley 232. To provide constant-tension in the cable 236, the ends of the cable preferably are terminated in the slide 242 against resilient biasing elements generally designated 250 in FIG. 12. The cable 236 as it stretches is pulled in a reverse direction by the resilient couplings 250 for maintaining its intended state.

During the plasma chamber load cycles, the Theta-drive motor turns the turntable of the R, TT wafer arm assembly to the TT coordinate of the queuing station in either embodiment of the R, TT movable wafer arm assembly. The vacuum lock of the associated interface is released, and the arm is extended under the wafer in the addressed cassette slot position. The arm is then retracted back into the load and unload module, and the vacuum lock is restored. The R, TT wafer arm assembly is then rotated to the TT coordinate of the selected plasma reactor. The associated chamber door is then rotated to its open condition for providing access to the selected reaction chamber, and the upper electrode is raised. The wafer receiving arm is then extended in the R direction through the associated slot valve opening and into the selected reaction chamber. As it approaches the limit of its maximum radial travel, the depending stop flange on the wafer arm abuts the upstanding end post on the turntable and, with continued radial motion, the bumper withdraws thereby freeing the wafer from peripheral friction engagement. The central pedestal of the lower electrode is then controllably raised by its pneumatic actuator, and therewith the wafer supported on the arm is elevated upwardly off of the wafer support platform. Thereafter, the wafer arm is retracted out of the plasma chamber through the open slot valve and back into the load and unload station. The pedestal is then controllably lowered. The wafer lowers therewith until the pedestal is in its retracted position and the wafer is supported on the surface of the lower electrode. The associated chamber door is then closed, and the upper electrode is lowered to that precise preselected gap that implements the particular plasma process being run. The intended reactants are then injected through the gas manifold of the upper electrode, and radio frequency power is applied. Whereupon, plasma etching of each single wafer is continued until the laser provides a signal indication that the proper end-point has been achieved. Thereafter, the RF power is turned-off, the vacuum lock is opended., and the above-described process is repeated, but in reverse order, for removing the wafer out of that plasma chamber and back into the load and unload station. The wafer can then be moved into another plasma reactor for a subsequent process in a two or more step processing mode, or back into the cassette in a one-step processing mode.

The load and unload module, queuing station, and plural reactors are operable in three basic modes, namely, where each reactor is simultaneously performing the same plasma reaction, where each plasma reactor is simultaneously performing two or more different plasma processes, and where the plasma reactors are severally being operated to provide multiple-step processing of single wafers before their return back to the queuing station. In each case, the wafers are transferred and processed in a controlled vacuum environment such that atmospheric exposure and handling induced contamination are wholly eliminated.

Figure 13:
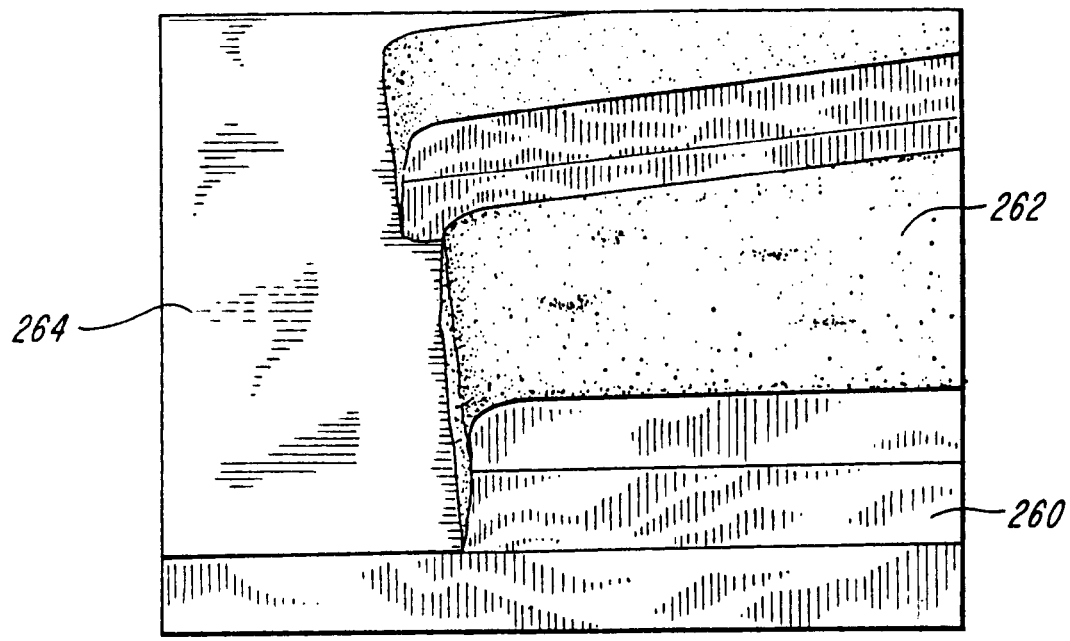
FIGS. 13–18 are SEM micrographs illustrating exemplary microstructures obtainable by the multiple-processing and contamination-free plasma etching system according to the present invention.
Figure 14:
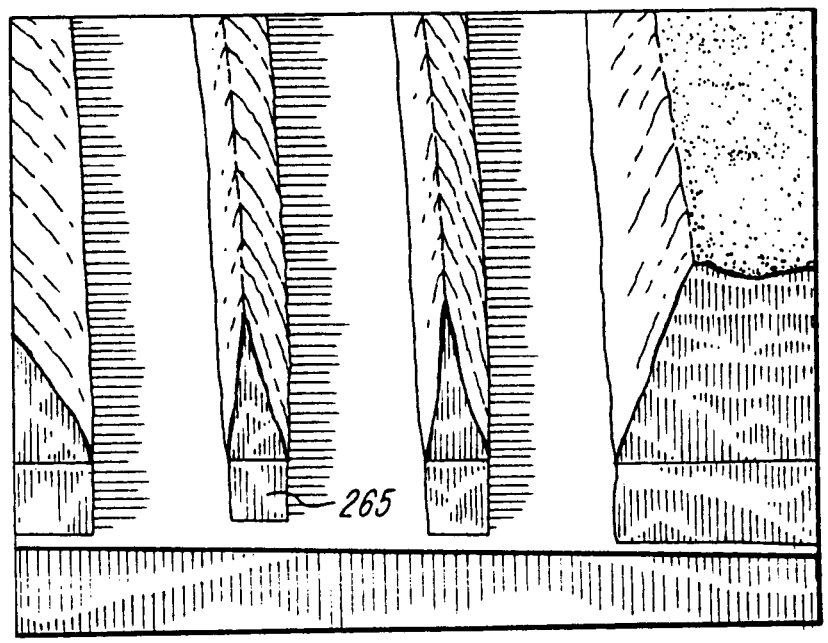
Figure 16:
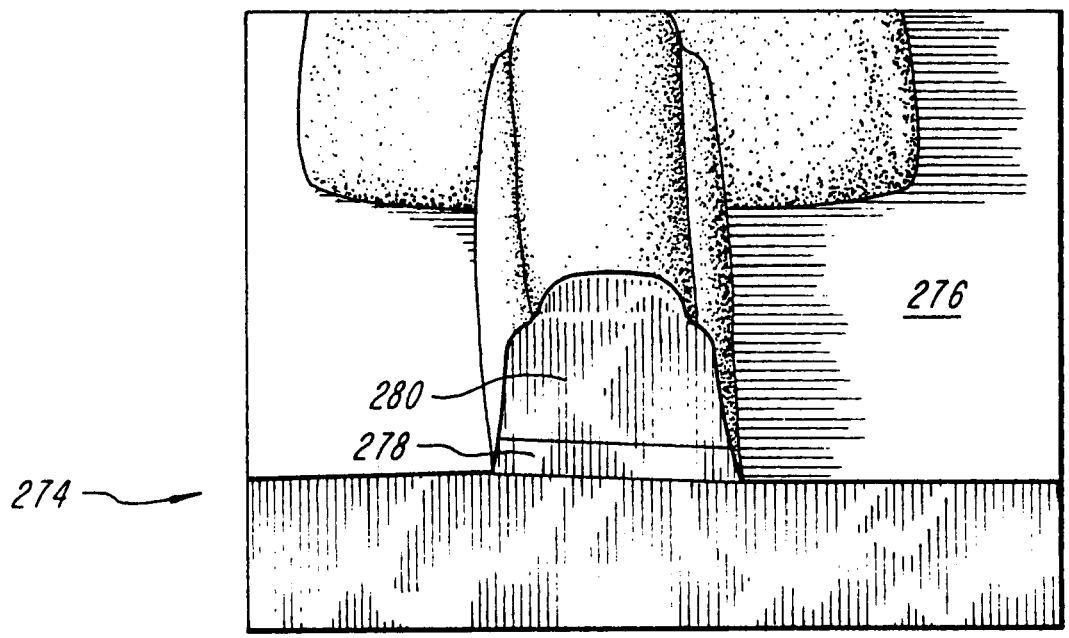
Figure 17:
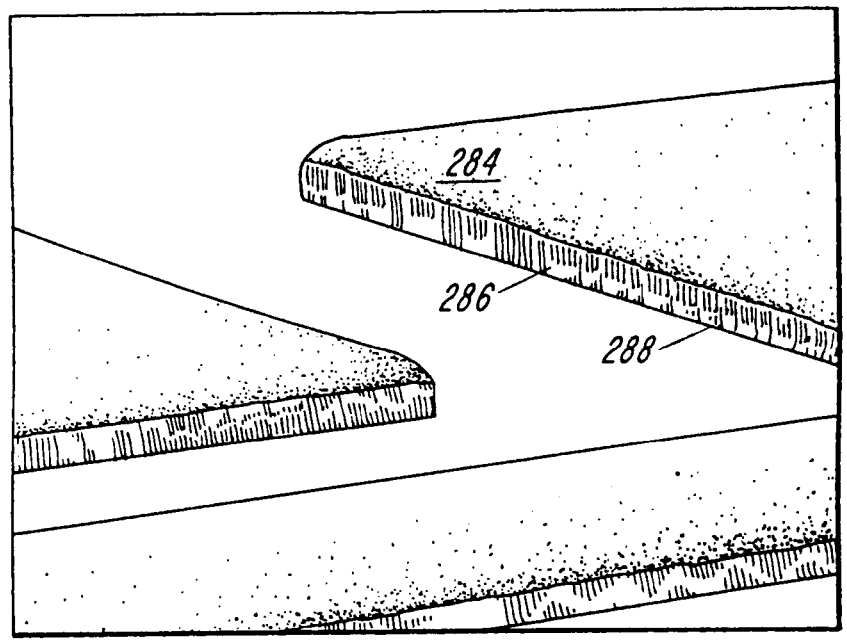
Figure 18:
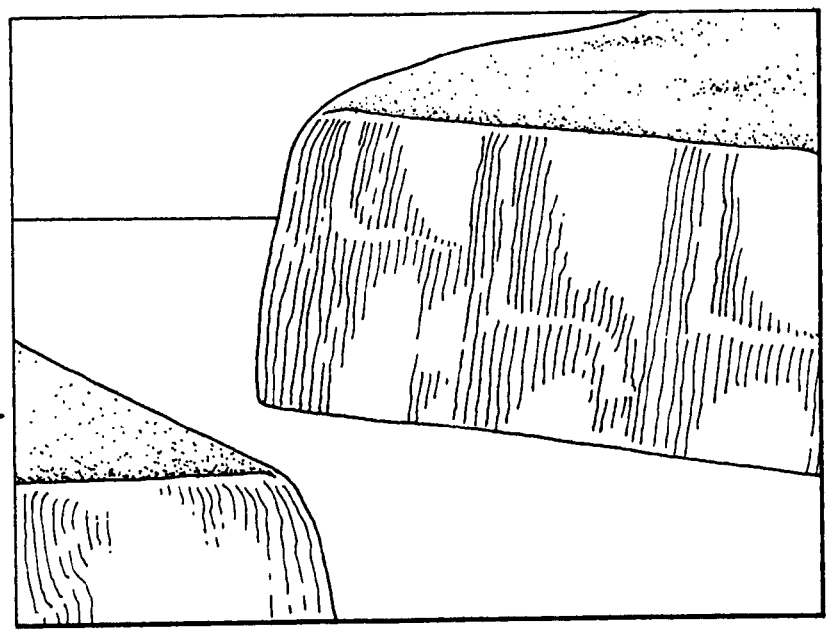

FIGS. 13–17 are scanning electron micrographs illustrating exemplary microstructures capable of being formed in a single-step process, and FIG. 18 is a scanning electron micrograph illustrating an exemplary microstructure capable of being fabricated in a double-step etch process. FIG. 13 shows generally at 260 polysilicon with an overlayed photoresist 262 on the surface of the silicon dioxide layer 264 of the wafer. For exemplary low-resistivity (12–30 ohms) doped polysilicon, $CCl_4$ at 20 sccm and $H_e$ at 30 sccm are applied to the plasma reactor at a pressure of 100 mt and a power of 300 watts. The etch occurs for approximately 1½ minutes. As shown in FIG. 14 doped polysilicon 265 having a comparatively high resistivity (30–200 ohms per sq.) and having a slopped profile mask is illustrated. For the illustrated microstructure, $SF_6$ at 50 sccm and freon 115 ($C_2ClF_5$) at 50 sccm are controllably injected into a plasma reactor at 150 mt pressure and a 100 watt power. After about 2½ minutes, the illustrated doped polysilicon microstructure is fabricated.

Figure 15:
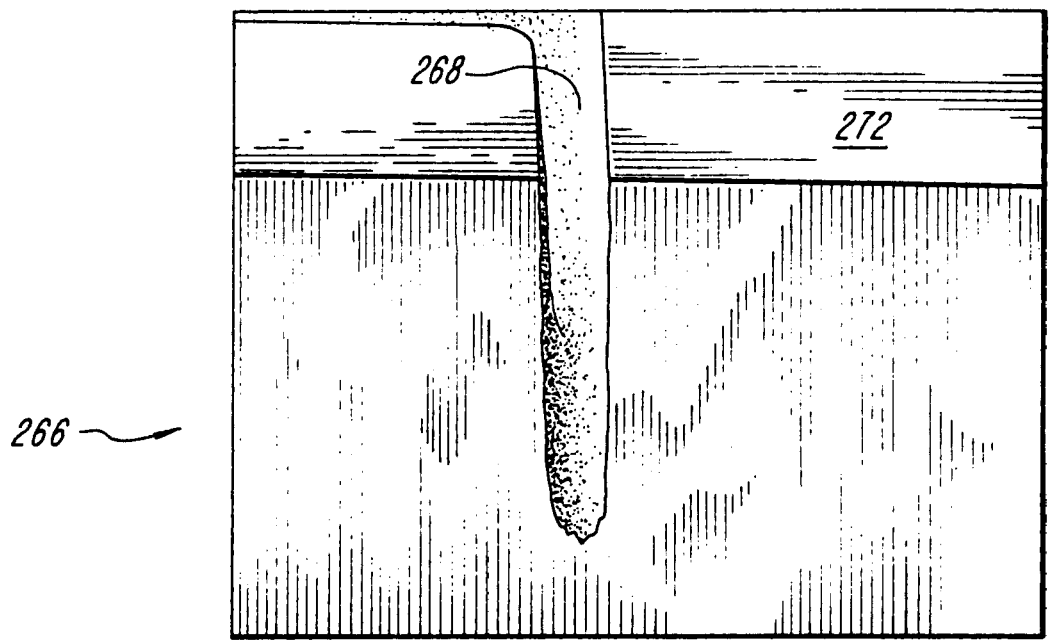

Referring now to FIG. 15, generally designated at 266 is a SEM illustrating an exemplary trench etch. The photoresist is removed, and a trench generally designated 268 is formed in the silicon 272 by injecting $BCl_3$ at 5 sccm and $Cl_2$ at 25 sccm into the plasma reactor at a 100 mt chamber pressure and at 750 watts power for about 20 minutes.

Referring now to FIG. 16, refractory silcide, TaSi/poly, is illustrated generally at 274. The silicon dioxide surface 276 is overlayed with a polysilicon layer 278 upon which is overlayed the TaSi/poly 280 over which is the photoresist. The microstructure is fabricated by injecting $CCl_4$ at 20 sccm and He at 30 sccm into a plasma reactor maintained at a chamber pressure of 80 mt and a radio frequency power of 300 watts for about 3½ minutes.

Referring now to FIG. 17, generally designated 282 is another microstructure exemplary of the single-step structures capable of being fabricated by the contamination-free and multiple-processing plasma reactor of the present invention. As illustrated, a photoresist 284 is layed over an aluminum and silicon layer 286 which is overlayed via a TiW layer 288 on the wafer surface. The illustrated structure was fabricated by injecting $BCl_3$ at 50 sccm with $Cl_2$ at 15 sccm into the plasma reactor maintained at 125 mt chamber pressure and a 300 watt RF power for about 2½ to 3½ minutes.

Referring now to FIG. 18, generally designated at 290 is a silicon dioxide/poly/silicon dioxide/poly sandwich structure illustrating an exemplary two-step process. A poly layer designated poly 1 and an oxide layer designed oxide are formed after etching with $C_2F_6$ at 100 sccm at a 700 mt pressure and a 600 watt radio frequency power in a first chamber. Thereafter, the upper poly 2 layer and the oxide and an overlayed photoresist layer are formed by a separate step employing $CCl_4$ at 20 sccm and He at 30 sccm in a second reaction chamber maintained at a 100 militore chamber pressure and a 600 watt radio frequency power.

Figure 19:
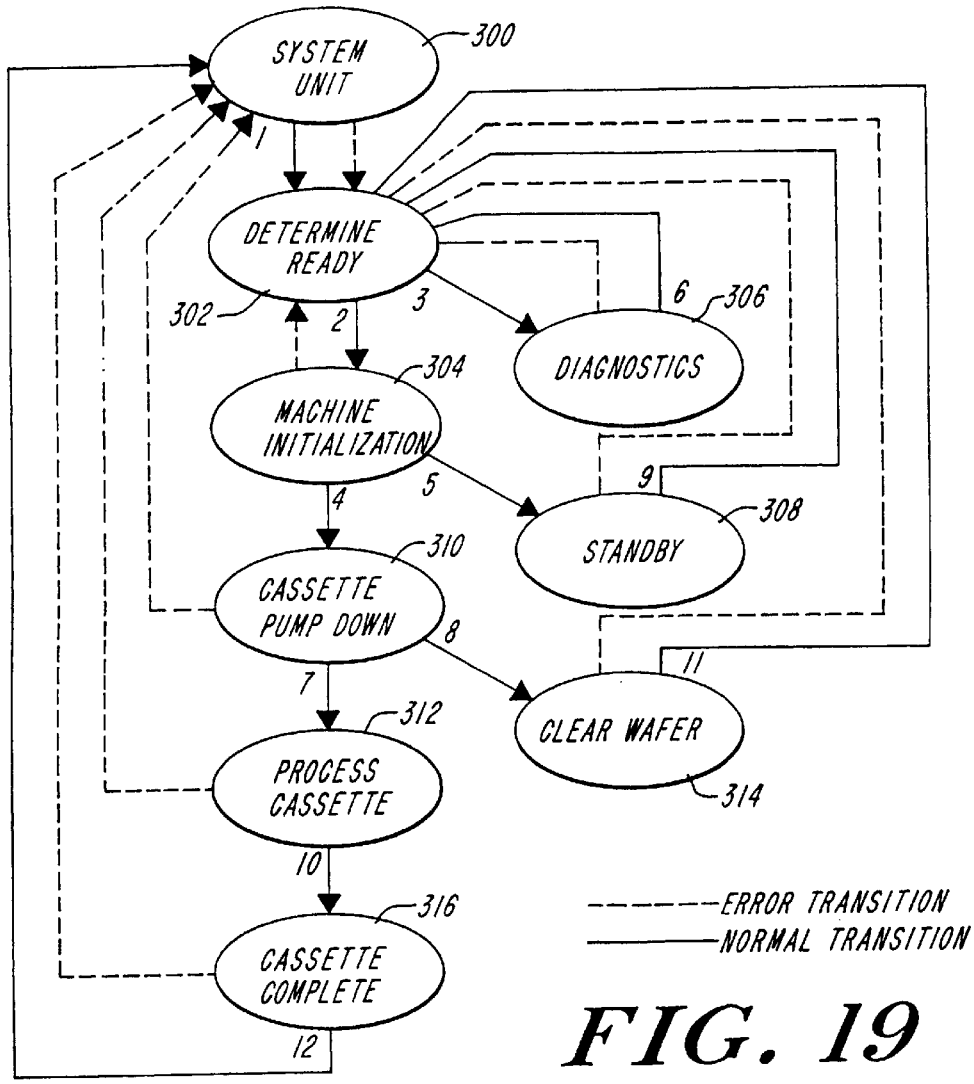
FIG. 19 is a system level state diagram describing system initialization and cassette insertion and extraction states.

With respect now to FIGS. 19–24, the processor control for wafer throughput is illustrated. In particular, FIG. 19 illustrates a state diagram for overall system operation. In the state 300, system initialization procedures are accomplished which take the system from a turn-on state through necessary warm-ups and start up proceedures. Transition to a subsequent state 302 occurs once the system initialization has been completed. State 302 exists until a cassette has been placed into the cassette queue station and all door interlock switches are activated. The transition from the determine ready state 302 to a machine initialization state 304 occurs once these conditions have been met and the operator initiates system operation through a start button, provided no other system interrupt signals or hold designations have occurred and provided the user has not activated the diagnostic state 306 which is alternatively entered from the determine ready state 302.

The diagnostic state 306 runs a set of diagnostics on the system should that state be entered by the user. Otherwise, the machine initialization state 304 accomplishes a final set of system power-ons, gas purge or other initialization steps which would not normally be entered in the system initialization state 300 for time and/or power considerations.

From the machine initialization state 304 a standby state 306 may be entered by operator designation through a standby button which effectively aborts the processing steps back to the determine ready state 302. Otherwise, from the machine initialization state 304, once the initialization functions have been completed, the system transitions to a cassette pump down state 310 in which a vacuum is drawn from the wafer queuing station 14 placing it into the environment of the transport arm and plural etch vessels. After pump down of the wafer queuing station 14, state 310 processing will normally transition to the state 312 in which the wafers and the cassette at the queuing station 14 are processed in sequence as illustrated in the subsequent figures. Alternatively, if in the determine ready state 302 the operator had activated a clear wafer instruction, processing would transition to a clear wafer state 314 in which, in liew of cassette processing, wafers are cleared from the system. In the case of each state 306, 308, and 314 processing, after completion of their state functions, will return to the determine ready state 302.

If the cassette processing state 312 is entered, the system processes each wafer in the cassette according to a wafer command list entered into the system and described below.

Once that cycle is complete, processing proceeds to a state 316 which vents the wafer queuing station 14 and waits until removal of the cassette at which point the system transitions to state 300.

Should any error occur in normal system operation, as determined by processor error detection, processing from each of the states of FIG. 19 will return to the system initialization state 300 to rerun the power-on initialization functions.

Figure 20:
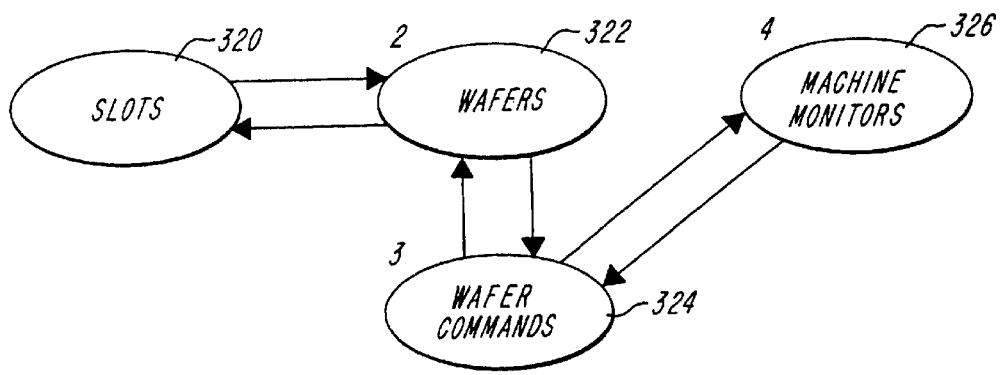
FIG. 20 is a state diagram identifying states associated with system processing of wafers and individual wafer processing instructions.

The operation within the cassette process state 312 follows a flexible processes control illustrated in the flow diagram of FIG. 20. As illustrated there processing proceeds between state 320 labeled slots, state 322 labeled wafers, state 324 labeled wafer commands, and state 326 labeled machine monitors. The processing of FIG. 20 is initiated when the state 312 is entered with a cassette of unprocessed wafers, and starts, and finishes, in state 320. State 320 initiates a wafer start command for each slot containing an unprocessed wafer using, for example, a top to bottom priority scheme, or any other priority scheme which may be programmed. From the state 320 for a selected slot, and corresponding wafer, processing proceeds to the wafer state 322. From state 322 the processing commands or specifications for each wafer are accessed in a subsequent state 324, wafer commands. The wafer commands will be programmed into the system corresponding to the desired processing of each wafer, for example, one or more etches for a designated time period or depth in a designated gas. The commands in the state 324 are executed in sequence, and each command commences a set of machine control operations which occur in state 326, machine monitors.

At the completion of each wafer command, representing for example, a single etch cycle for a wafer as described below, processing returns to the wafer command state 324 to execute another wafer command. After all wafer commands have been executed for a particular wafer, processing returns to the state 322 and from thence to state 320 thereby sequencing through the wafers and the cassette slots.

Figure 21:
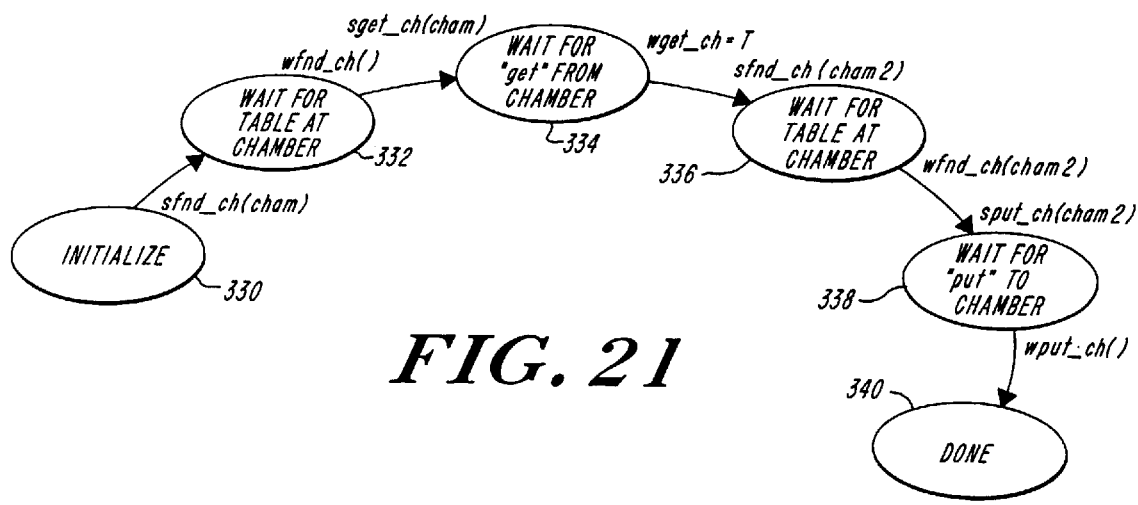
FIG. 21 is a state diagram identifying states in sequencing a wafer from one plasma etch vessel or chamber to another.
Figure 22:
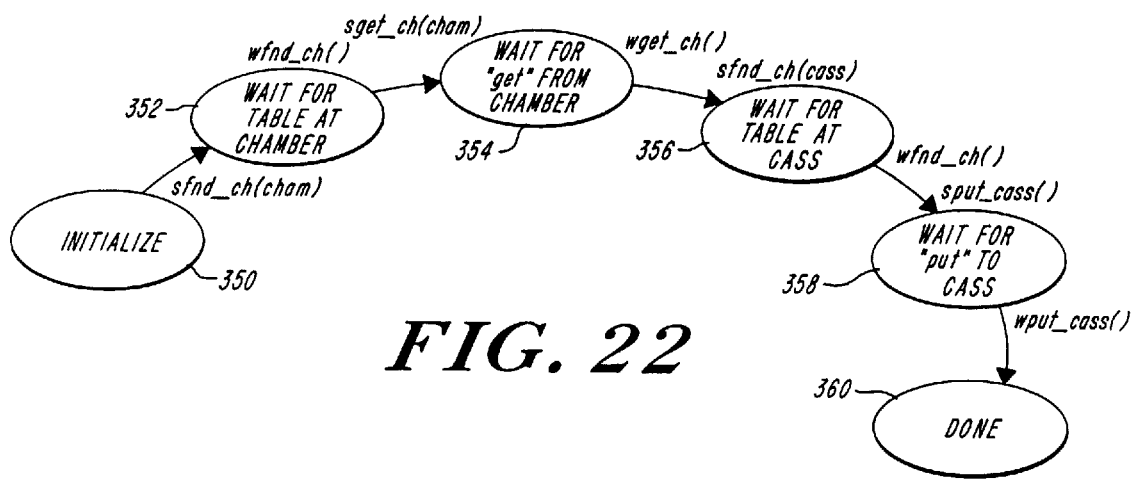
FIG. 22 is a state diagram identifying wafer transport from a vessel or chamber to its cassette slot.
Figure 23:
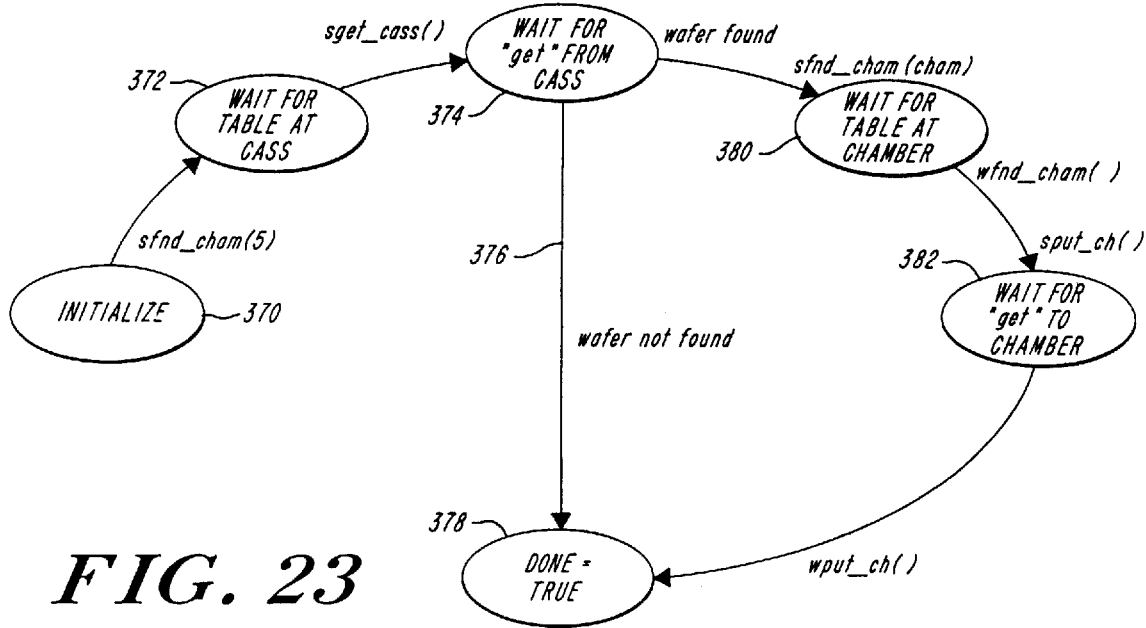
FIG. 23 is a state diagram identifying wafer transport from a cassette slot to a vessel or chamber.
Figure 24:
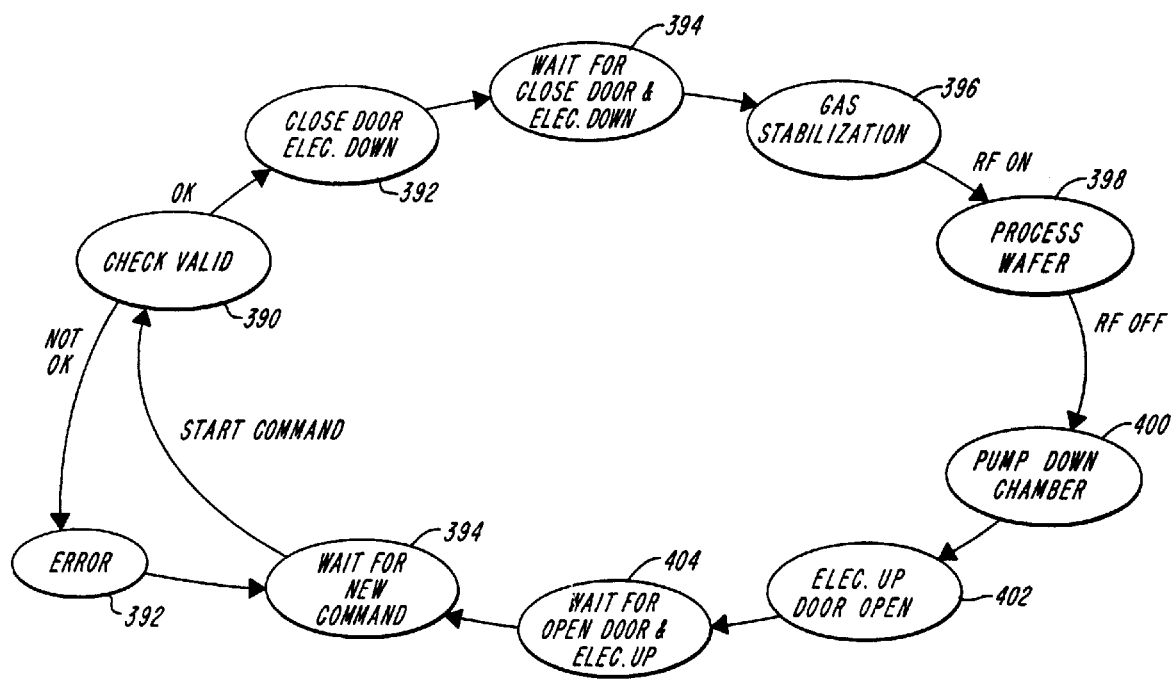
FIG. 24 is a state diagram identifying the wafer processing within an individual plasma etch vessel or chamber.

Processing within the machine control state 326 is in accordance with the wafer transport algorithms of FIGS. 21, 22 and 23 and the internal chamber or vessel processing algorithm of FIG. 24. In each case where processing halts for receipt of system instructions to proceed, processor state evaluation checks for existence conditions necessary for the unit to proceed to the next step.

With particular regard to FIG. 21 illustrates processing for moving a wafer from one chamber or vessel to another, in accordance with wafer commands specifying multiple chamber or vessel processing. As shown there processing commences at initialization state 330. Subsequent state 332 directs the transport arm wafer support table from one chamber or vessel to the desired chamber or vessel wherein the wafer to be moved is located. Once that positioning is accomplished a subsequent state 334 activates the valve and arm mechanisms in a transition to a state 336. In state 336 the system repositions the transport arm wafer support table to the destination chamber or vessel and transitions to a state 338 which, when it receives control signals, activates the arm mechanism and valving on the applicable chamber to place the wafer in that particular chamber in the transition to a state 340. When state 340 is reached, the wafer relocation function is complete and processing returns to the next wafer command in state 324.

FIG. 22 illustrates the processing wherein a wafer is moved from a chamber or etch vessel to a slot of the cassette. From an initialization state 350 processing transitions to a state 352 which awaits the direction of the transport arm wafer support table to the desired chamber having the wafer to be returned to the cassette. Once the proper positioning is accomplished, the transition from state 352 to state 354 sends a request to the command list asking to be instructed to remove the wafer from the chamber. When that instruction is received in state 354, the transition to state 356 executes the machine instruction to open the valves and move the transport arm to pick up the wafer in the chamber and extract it from the chamber or vessel and in addition to request from the wafer command list the instructions to move to the cassette. When those instructions are executed and the arm is positioned to apply a wafer to the cassette, the system transitions to state 358 and sends a request to the wafer processing list for instructions to place the wafer into the cassette and identified slot. When that information is received the transition to the done state 360 executes the wafer insertion into the cassettes slot and returns processing back to the algorithm of FIG. 20.

FIG. 23 illustrates the algorithm for transferring a wafer from the cassette to a designated chamber in accordance with instructions in the wafer command list. From an initialize state 370, processing transitions to a state 372 in which the request is sent to the command list for instructions to position the arm to the cassette and such arm manipulation is executed. When the arm is appropriately positioned in state 372, the system transitions to state 374 in which a request for the instructions to extract a wafer from the cassette is sent. The state 374 has two possible outcomes, in the first represented by branch 376, a wafer is not found in the slot in which the system has been instructed to retrieve it by the transport arm. In this case the system transitions to a done state 378 indicating that the algorithm of FIG. 23 has progressed as far as it can, albeit in an abort condition. In the other possible outcome of state 374, the wafer is found and the system transitions from state 374 to state 380 in which instructions are received from the wafer processing list to position the transport arm support table at the destination chamber or vessel. When, in state 380, that destination chamber is reached, the system transitions to a state 382 in which the system requests and receives instructions from the command list (if the chamber is ready) to insert that wafer into the chamber. In the transition from state 382 to the completed state 378, the mechanisms of the arm and the chamber valving are activated in order to install the wafer into the chamber.

FIG. 24 illustrates the processing of the system for accomplishing wafer etching within a chamber to which the system has allocated a wafer from the cassette at the queuing station.

The processing of FIG. 24 is initiated by a start command obtained from the command list which initiates a state 390. The state 390 loops through an error recognition state 392 to a start command wait step 394 if the start command is determined to have incorrect signature. Otherwise, processing from a state 390 proceeds to a state 392 in which the valve to the chamber is sealed and the electrode spacing set to the etch condition. A subsequent step 394 waits for confirmation signals from microswitches indicating proper gate closure and electrode positioning. Subsequently a state 396 commences the flow of a gas, selected from the wafer command list, for the desired processing and waits for a steady state gas condition, based on time or other factors, to occur. Subsequently a transition to a state 398 activates the RF plasma generation between the electrodes used for plasma etching within the gas and wafer processing by gas vapor etch continues until a parameter indicating complete processing is obtained. Such a parameter may be a function of time, detected etch depth, or other factors. Once wafer processing is indicated as complete, the transition from state 398 to state 400 deactivates the RF and in state 400 the gas environment in the chamber is evacuated so that, in subsequent state 402, the electrodes can be respaced for wafer removal, and the gate or chamber doors opened to the environment of the transport arm without fear of leaking reactor gas into that environment. State 402 transitions to state 404 in which the system awaits confirmation by microswitch activation of proper electrode spacing and opening and transitions to state 394 in which system processing returns to the flexible process control of FIG. 20.

Many modifications of the presently disclosed invention will become apparent to those skilled in the art without departing from the scope of the appended claims.

What is claimed is:

1. A substrate surface processing system, comprising:
   a plurality of surface processing vessels each having an ingress and egress defining port that are arrayed about a spacial locus in such a way that the several ports thereof are accessible from a single location spaced from the several ports;
   a substrate queuing station spaced with the plural vessels along the same spacial locus and adapted to contain a plurality of substrates, defining a substrate access port accessible from said single location;
   a plurality of valves individually coupled to corresponding ones of said plurality of surface processing vessel ingress and egress ports and to said substrate queuing station substrate access port;
   a transfer device disposed at said single location and cooperative with corresponding ones of said plurality of valves for moving substrates from and to said substrate access port of said queuing station from and to selected ones of said surface processing vessels through the associated one of said ingress and egress ports thereof; and
   a processor in communication with said vessels, said transfer mechanism, and said plurality of valves, providing selectable single and multi-step substrate surface processing of said plurality of substrates by accessing a process command for a given substrate corresponding to desired processing of said substrate.

2. A substrate processing system, comprising:
   a plurality of processing vessels each having an ingress and egress port;
   a substrate queuing station adapted to contain a plurality of substrates and including a substrate access port;
   a plurality of valves individually coupled to corresponding ones of said plurality of processing vessel ingress and egress ports and to said substrate queuing station substrate access port;
   a transfer device cooperative with corresponding ones of said plurality of valves for moving substrates from and to said substrate access port of said queuing station from and to selected ones of said surface processing vessels through the associated one of said ingress and egress ports thereof; and
   a processor in communication with said vessels, said transfer mechanism, and said plurality of valves, providing selectable single and multi-step processing of said plurality of substrates by accessing a process command for a given substrate corresponding to desired processing of said substrate.

3. A substrate surface processing system, comprising:
   a vacuum load and unload chamber, having a closable entrance;
   at least one processing chamber mounted to said load and unload chamber and communicating therewith via openings in the adjacent chambers;
   each of said processing chambers including a substrate support means and being adapted for performing at least one substrate processing operation;
   a single-substrate transfer device within the load and unload chamber for moving substrates from and to selected ones of said processing chambers through said opening in said processing chambers; and
   a processor operatively connected to said system to provide control of multi-step, multi-chamber operations.

4. The system of claim 3 wherein there are a plurality of said at least one processing chamber.

5. A substrate surface processing system, comprising:
   a vacuum load and unload chamber having a closable entrance;
   at least two processing chambers mounted to said load and unload chamber and communicating therewith via openings in the adjacent chambers, each of said processing chambers including a substrate support and being adapted for performing at least one substrate processing operation; and
   single-substrate transfer device within the load and unload chamber for moving substrates from and to selected ones of said processing chambers through said openings in said processing chambers.

6. The system of claim 5, further comprising a processor operatively connected to said system.

7. The system of Claim 6 wherein said processor provides control of multi-step, multi-chamber operations.

8. The system of claim 5, further comprising a queuing station adapted to contain a plurality of substrates and wherein said transfer device is capable of moving substrates from said queuing station through an opening therein into said load and unload chamber.

9. The system of claim 8, further comprising respective selectively openable valves disposed in said openings between said load and unload chamber and said processing stations and said queuing station.

* * * * *